(12) United States Patent
Arao

(10) Patent No.: US 8,502,231 B2
(45) Date of Patent: Aug. 6, 2013

(54) SEMICONDUCTOR DEVICE

(75) Inventor: Tatsuya Arao, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/474,993

(22) Filed: May 18, 2012

(65) Prior Publication Data

US 2012/0235154 A1 Sep. 20, 2012

Related U.S. Application Data

(63) Continuation of application No. 13/103,474, filed on May 9, 2011, now Pat. No. 8,183,569, which is a continuation of application No. 12/335,058, filed on Dec. 15, 2008, now Pat. No. 7,939,827, which is a continuation of application No. 11/007,052, filed on Dec. 8, 2004, now Pat. No. 7,465,957, which is a continuation of application No. 10/254,280, filed on Sep. 25, 2002, now Pat. No. 6,831,297.

(30) Foreign Application Priority Data

Sep. 26, 2001 (JP) .................................. 2001-293711

(51) Int. Cl.
*H01L 29/12* (2006.01)
(52) U.S. Cl.
USPC .......... 257/71; 257/59; 257/72; 257/E21.413; 257/E21.414; 257/E33.053
(58) Field of Classification Search
USPC ................. 257/59, 71, 72, E21.413, E21.414, 257/E33.053
See application file for complete search history.

(56) References Cited

U.S. PATENT DOCUMENTS

| | | | |
|---|---|---|---|
| 5,159,476 | A | 10/1992 | Hayashi |
| 5,182,661 | A | 1/1993 | Ikeda et al. |
| 5,233,211 | A | 8/1993 | Hayashi et al. |
| 5,499,123 | A | 3/1996 | Mikoshiba |
| 5,614,730 | A | 3/1997 | Nakazawa et al. |
| 5,672,518 | A | 9/1997 | Hayashi et al. |

(Continued)

FOREIGN PATENT DOCUMENTS

| | | |
|---|---|---|
| EP | 0 376 329 A2 | 7/1990 |
| EP | 0 450 941 A2 | 10/1991 |

(Continued)

OTHER PUBLICATIONS

Hirai, Y. et al, "A High-Aperture-Ratio a-Si TFT Liquid Crystal Light Valve for Workstations," NEC Research & Development, vol. 35, No. 2, Apr. 1994, pp. 165-170.

(Continued)

*Primary Examiner* — Andy Huynh
(74) *Attorney, Agent, or Firm* — Husch Blackwell LLP

(57) ABSTRACT

To realize a semiconductor device including a capacitor element capable of obtaining a sufficient capacitor without reducing an opening ratio, in which a pixel electrode is flattened in order to control a defect in orientation of liquid crystal. A semiconductor device of the present invention includes a light-shielding film formed on the thin film transistor, a capacitor insulating film formed on the light-shielding film, a conductive layer formed on the capacitor insulating film, and a pixel electrode that is formed so as to be electrically connected to the conductive layer, in which a storage capacitor element comprises the light-shielding film, the capacitor insulating film, and the conductive layer, whereby an area of a region serving as the capacitor element can be increased.

41 Claims, 12 Drawing Sheets

U.S. PATENT DOCUMENTS

| | | | |
|---|---|---|---|
| 5,708,485 | A | 1/1998 | Sato et al. |
| 5,759,878 | A | 6/1998 | Hayashi et al. |
| 5,818,552 | A | 10/1998 | Sato |
| 5,889,302 | A | 3/1999 | Liu |
| 5,917,563 | A | 6/1999 | Matsushima |
| 5,923,390 | A | 7/1999 | Jung Mok et al. |
| 5,926,699 | A | 7/1999 | Hayashi et al. |
| 6,040,200 | A | 3/2000 | Hayashi et al. |
| 6,067,131 | A | 5/2000 | Sato |
| RE36,836 | E | 8/2000 | Hayashi et al. |
| 6,141,066 | A | 10/2000 | Matsushima |
| 6,144,082 | A | 11/2000 | Yamazaki et al. |
| 6,252,248 | B1 | 6/2001 | Sano et al. |
| 6,255,131 | B1 | 7/2001 | Mori et al. |
| 6,271,543 | B1 | 8/2001 | Ohtani et al. |
| 6,297,862 | B1 | 10/2001 | Murade |
| 6,327,006 | B1 | 12/2001 | Sato et al. |
| 6,356,318 | B1 | 3/2002 | Kawahata |
| 6,359,665 | B1 | 3/2002 | Matsushima |
| 6,380,561 | B1 | 4/2002 | Ohtani et al. |
| 6,392,255 | B1 | 5/2002 | Shibata et al. |
| 6,433,841 | B1 | 8/2002 | Murade et al. |
| 6,576,924 | B1 | 6/2003 | Yamazaki et al. |
| 6,576,926 | B1 | 6/2003 | Yamazaki et al. |
| 6,587,165 | B2 | 7/2003 | Hashimoto et al. |
| 6,620,660 | B2 | 9/2003 | Ohtani et al. |
| 6,671,025 | B1 | 12/2003 | Ikeda et al. |
| 6,674,136 | B1 | 1/2004 | Ohtani |
| 6,680,488 | B2 | 1/2004 | Shibata |
| 6,690,031 | B1 | 2/2004 | Ohtani et al. |
| 6,770,908 | B2 | 8/2004 | Sato |
| 6,806,932 | B2 | 10/2004 | Matsushima |
| 6,893,503 | B1 | 5/2005 | Ohnuma et al. |
| 7,132,317 | B2 | 11/2006 | Arao |
| 7,288,789 | B2 | 10/2007 | Yamazaki et al. |
| 2004/0201788 | A1 | 10/2004 | Matsushima |

FOREIGN PATENT DOCUMENTS

| | | |
|---|---|---|
| EP | 0 464 579 A2 | 1/1992 |
| EP | 0 484 965 A2 | 5/1992 |
| EP | 0 604 006 A2 | 6/1994 |
| EP | 0 668 528 A1 | 8/1995 |
| EP | 0 733 929 A2 | 9/1996 |
| EP | 0 762 180 A1 | 3/1997 |
| EP | 0 997 769 A2 | 5/2000 |
| EP | 1 028 469 A2 | 8/2000 |
| EP | 1 033 755 A2 | 9/2000 |
| EP | 2 154 719 A2 | 2/2010 |
| JP | 59-121876 | 7/1984 |
| JP | 2-153323 | 6/1990 |
| JP | 2-176725 | 7/1990 |
| JP | 3-80225 | 4/1991 |
| JP | 3-211528 | 9/1991 |
| JP | 3-239229 | 10/1991 |
| JP | 3-274029 | 12/1991 |
| JP | 4-56828 | 2/1992 |
| JP | 4-307521 | 10/1992 |
| JP | 4-336530 | 11/1992 |
| JP | 5-27266 | 2/1993 |
| JP | 6-138484 | 5/1994 |
| JP | 7-28093 | 1/1995 |
| JP | 8-78329 | 3/1996 |
| JP | 8-262494 | 10/1996 |
| JP | 9-43639 | 2/1997 |
| JP | 10-189999 | 7/1998 |
| JP | 10-270363 | 10/1998 |
| JP | 10-339885 | 12/1998 |
| JP | 11-119260 | 4/1999 |
| JP | 11-249171 | 9/1999 |
| JP | 11-311805 | 11/1999 |
| JP | 2000-10120 | 1/2000 |
| JP | 2000-131716 | 5/2000 |
| JP | 2000-299468 | 10/2000 |
| JP | 2000-315798 | 11/2000 |
| JP | 2001-13520 | 1/2001 |

OTHER PUBLICATIONS

Yoo, J-S et al, "Pixel Design for TFT-LCD with Double Gate Poly-Si TFT and Double Layer Storage Capacitor," Proceedings of the 4th Asian Symposium on Information Display, 1997, pp. 219-222.

Kumar, A. et al, "Kink-Free Polycrystalline Silicon Double-Gate Elevated-Channel Thin Film Transistors," IEEE Transactions on Electron Devices, vol. 45, No. 12, Dec. 1998, pp. 2514-2520.

i ◨ : REGION FUNCTIONING AS STORAGE CAPACITOR ELEMENT ACCORDING TO SHORTENING DISTANCE BETWEEN LIGHT SHIELDING FILM AND PIXEL ELECTRODE ii ◪ : REGION NOT FUNCTIONING AS STORAGE CAPACITOR ELEMENT ACCORDING TO FLATTENING FILM (B)

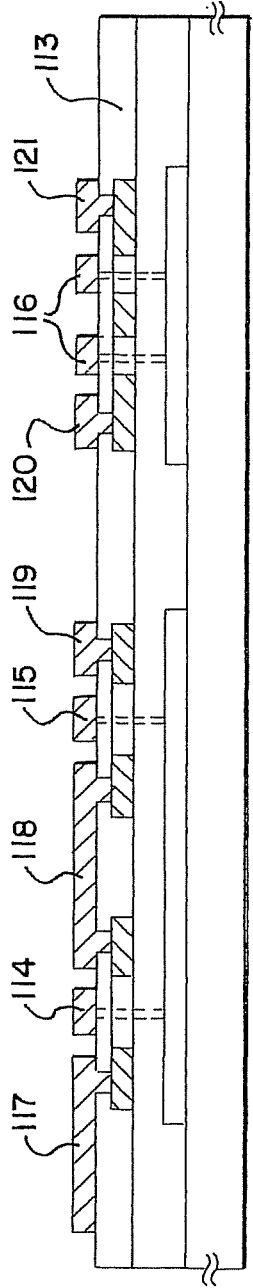
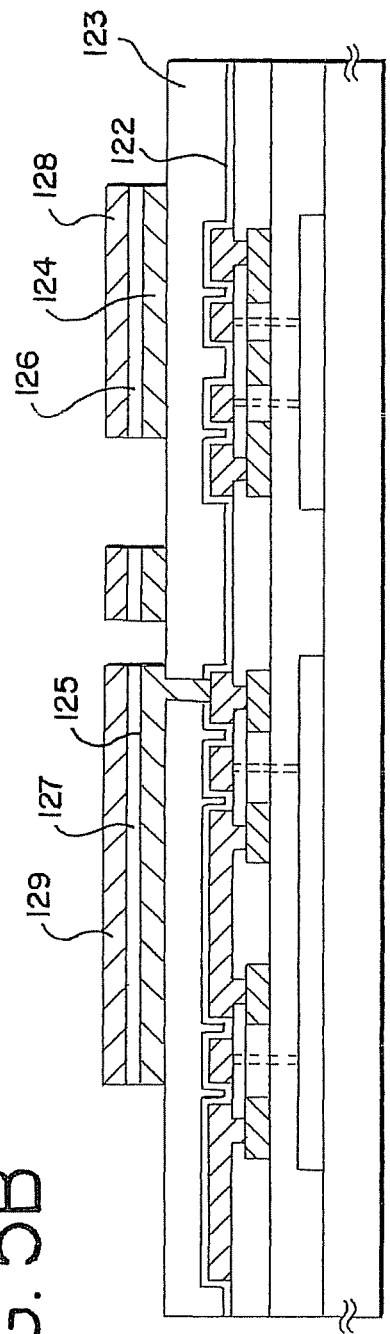
FIG. 5A
FIG. 5B

PORTION FORMED ACCORDING TO SHIFTING CONDUCTIVE LAYER AND LIGHT SHIELDING FILM

PORTION FORMED IN GENTLE STEP

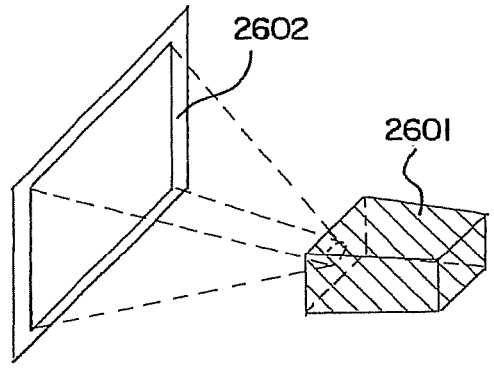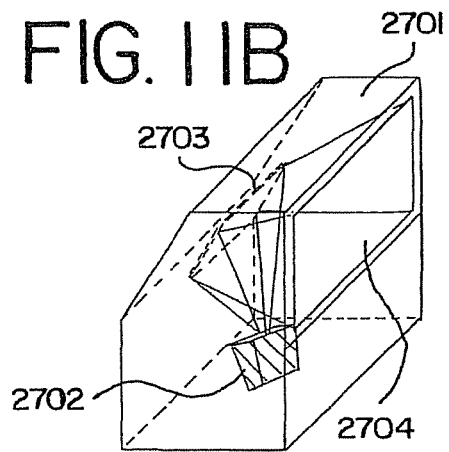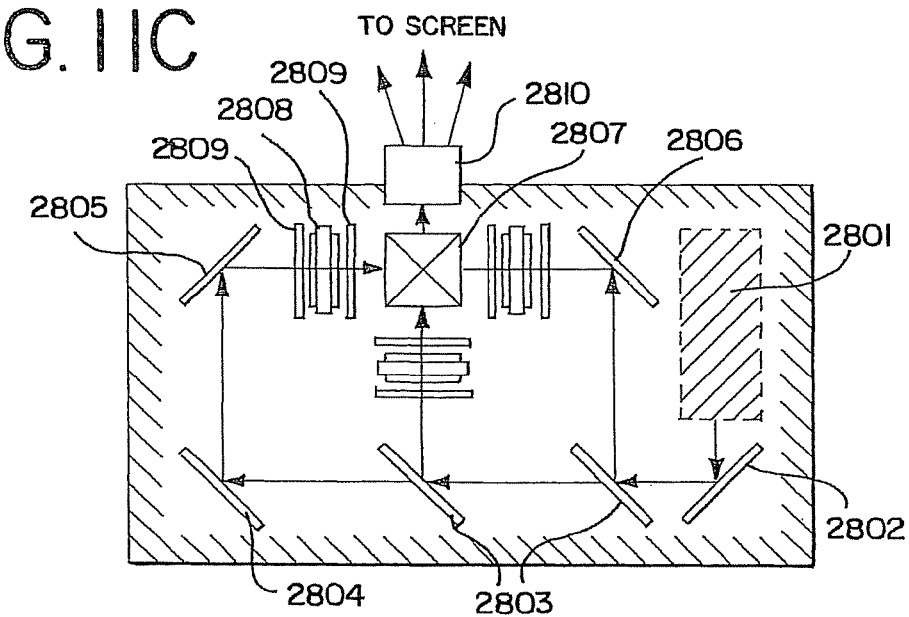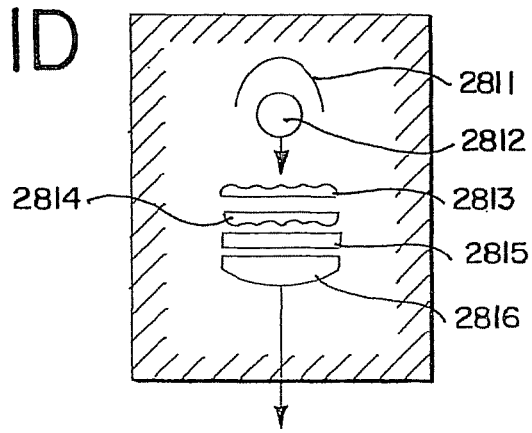

SEMICONDUCTOR DEVICE

This application is a continuation of copending U.S. application Ser. No. 13/103,474, filed on May 9, 2011 now U.S. Pat. No. 8,183,569 which is a continuation of U.S. application Ser. No. 12/335,058, filed on Dec. 15, 2008 (now U.S. Pat. No. 7,939,827 issued May 10, 2011) which is a continuation of U.S. application Ser. No. 11/007,052, filed on Dec. 8, 2004 (now U.S. Pat. No. 7,465,957 issued Dec. 16, 2008) which is a continuation of U.S. application Ser. No. 10/254,280, filed on Sep. 25, 2002 (now U.S. Pat. No. 6,831,297 issued Dec. 14, 2004).

BACKGROUND OF THE INVENTION

1. Field of the Invention

The present invention relates to a liquid crystal display device in which a semiconductor device such as a transistor formed on an insulator, in particular, a field effect transistor, and typically a MOS (metal oxide semiconductor) transistor, a thin film transistor (hereinafter, referred to as TFT) is used as a switching element in a pixel portion. The present invention also relates to a liquid crystal display device including a circuit or a driving circuit manufactured by using the semiconductor device, and to an electric appliance in which the liquid crystal display device is used for a display portion.

2. Description of the Related Art

Recently, there has been growing a use of the liquid crystal display device in a monitor of a personal computer or a display device of a television, in which liquid crystal is interposed between a pair of substrates and an electric field is applied to the pair of substrates to perform a display through a liquid crystal orientation.

Further, due to an improvement in a technique of crystallizing a semiconductor film, the liquid crystal display device is also realized in which a driving circuit is incorporated into one substrate.

Here, for the TFT of the driving circuit, high field effect mobility is required, whereas low leak current characteristics are required for the TFT used as the switching element in each pixel of the pixel portion. Thus, it is important to hold a charge (signal) and even a slight amount of leak current generated during a holding time at which the TFT is in an OFF state causes a deterioration of an image quality and a decrease in a contrast.

However, the TFT involves such a problem that when a semiconductor layer is irradiated with a light, optical excitation occurs to generate an optical leakage current. Therefore, it is important that a light-shielding film for covering the TFT is formed to block the light sufficiently to thereby prevent the light irradiation to the semiconductor layer or, assuming that a leak current is generated, it is important to secure a storage capacitor large enough to hold a signal in one frame period even in such a case.

Thus, as a structure in which a storage capacitor is formed and further a leak light can be shielded, a cell is disclosed in JP 2924506 B, in which a source electrode and a drain electrode are formed before an interlayer film is formed and a light-shielding film made of aluminum is formed on the interlayer film and subjected to anodic oxidation to form an anodized film made of $Al_2O_3$ on a top surface and a side surface of the light-shielding film, and then a transparent pixel electrode is formed thereon to complete the cell including the storage capacitor consisting of the light-shielding film, an $Al_2O_3$ film, and the transparent pixel electrode that are arranged in the stated order.

An electrostatic capacitance (hereinafter, referred to as a capacitance) of a storage capacitor element is in inverse proportion to a thickness of a capacitor insulating film (in this specification, referred to as a dielectric film sandwiched between a pair of electrodes constituted of a conductor) and in proportion to a dielectric constant of the capacitor insulating film and a surface area of the electrode. Therefore, in the structure disclosed in JP 2924506 B, since the capacitor insulating film between the light-shielding film and the transparent pixel electrode is made of the anodized film and maintained almost constant, a region where the light-shielding film and the transparent pixel electrode overlap each other can substantially function as the storage capacitor element.

However, in the liquid crystal display device, there arises a problem in that a defective display is caused by a defect in orientation of the liquid crystal. The defect in orientation of the liquid crystal occurs as follows. Steps or unevennesses on the surface of the pixel electrode affect the surface of an orientation film and involve uneven rubbing on the orientation film, and finally causes the defect in orientation of the liquid crystal and the deterioration of the image quality. In the structure disclosed in JP 2924506 B, as shown in FIG. 1A, the step of the pixel electrode exists in a portion outside a light-shielded region by the light-shielding film (a region transmissive of light) and there arises a problem in that the light accidentally passes therethrough due to the defect in orientation of the liquid crystal, or the like.

However, in the display device including a laminate structure consisting of a number of layers, it is unavoidable that the steps or unevennesses occur on the surface of the pixel electrode and affect the surface of the orientation film as well, followed by decrease in the contrast due to a light accidentally passing therethrough. Thus, a method of flattening the steps or unevennesses of the pixel electrode, particularly, a region transmissive of light which contributes to a display of the pixel has been considered.

Thus, a method is devised in which the light-shielding film is formed on an element substrate side and the step caused through the formation is flattened to form the pixel electrode. However, according to this method, when the storage capacitor element is formed between the light-shielding film and the pixel electrode, as shown in FIG. 1B, an interlayer distance is made large between the light-shielding film and the pixel electrode to thereby make a region functioning as the capacitor element narrow, with the result that it is impossible to secure the sufficient storage capacitor.

Due to a slight amount of off-leak current flowing while the TFT is in an OFF state, the decrease in the contrast and a nonuniform image quality as a panel are caused, so that it is unavoidable that the storage capacitor element is formed for complementation thereof. However, if the storage capacitor element is formed in another region, for example, as shown in FIG. 1C, if the storage capacitor element is constituted of a semiconductor layer, a gate insulating film, and a conductive layer formed on the gate insulating film with an active layer of the TFT extended, an opening ratio of the pixel becomes small, so that a display capacity is decreased in terms of brightness.

SUMMARY OF THE INVENTION

The present invention has been made in view of the above-mentioned problem, and an object of the present invention is to realize a semiconductor device including a capacitor element capable of obtaining a sufficient storage capacitor without reducing an opening ratio, in which a pixel electrode is flattened in order to control a defect in orientation of liquid crystal.

According to the present invention, there is provided a semiconductor device, including: a thin film transistor; a storage capacitor element; a light-shielding film formed on the thin film transistor; a capacitor insulating film formed on the light-shielding film; a conductive layer formed on the capacitor insulating film; an insulating film formed on the conductive layer; and a pixel electrode formed on the insulating film, in which: the conductive layer and the pixel electrode are electrically connected; and the storage capacitor element is composed of the light-shielding film, the capacitor insulating film, and the conductive layer.

Also, according to the present invention, the semiconductor device includes: a light-shielding film formed on a thin film transistor; a capacitor insulating film formed on the light-shielding film; a conductive layer formed on the capacitor insulating film; an insulating film formed on the conductive layer; and a pixel electrode formed on the insulating film, in which: the storage capacitor element is composed of the light-shielding film, the capacitor insulating film, and the conductive layer; and the conductive layer and the pixel electrode are brought into contact with each other through an opening formed in the insulating film, the opening formed on the light-shielding film.

Further, according to the present invention, there is provided the semiconductor device, including: a thin film transistor; a storage capacitor element; a light-shielding film formed on the thin film transistor; a capacitor insulating film formed on the light-shielding film; a conductive layer formed on the capacitor insulating film; an insulating film formed on the conductive layer; and a pixel electrode formed on the insulating film, in which: the storage capacitor element is composed of the light-shielding film, the capacitor insulating film, and the conductive layer; the conductive layer and the pixel electrode are brought into contact with each other through an opening formed in the insulating film; the insulating film is formed so that a step of the pixel electrode caused by the capacitor insulating film and the conductive layer is flattened; and an inner wall of the opening and the step are formed on the light-shielding film.

Further, according to the present invention, there is provided the semiconductor device, including: a thin film transistor; a storage capacitor element; a light-shielding film formed on the thin film transistor; a capacitor insulating film formed on the light-shielding film; a conductive layer formed on the capacitor insulating film; an insulating film formed on the conductive layer; and a pixel electrode formed on the insulating film, in which: the storage capacitor element is composed of the light-shielding film, the capacitor insulating film, and the conductive layer; the conductive layer and the pixel electrode are brought into contact with each other through an opening formed in the insulating film; and the insulating film is formed so that a step between one pixel electrode and other pixel electrode adjacent thereto is flattened.

Further, according to the present invention, there is provided the semiconductor device, including: a thin film transistor; a storage capacitor element; a light-shielding film formed on the thin film transistor; a capacitor insulating film formed on the light-shielding film; a conductive layer formed on the capacitor insulating film; an insulating film formed on the conductive layer; and a pixel electrode formed on the insulating film, in which: the storage capacitor element is composed of the light-shielding film, the capacitor insulating film, and the conductive layer; the conductive layer and the pixel electrode are brought into contact with each other through an opening formed in the insulating film; and the conductive layer and the pixel electrode are aligned at end surfaces thereof between adjacent pixels.

Further, according to the present invention, there is provided the semiconductor device, including: a thin film transistor; a storage capacitor element; a light-shielding film formed on the thin film transistor; a capacitor insulating film formed on the light-shielding film; a conductive layer formed on the capacitor insulating film; an insulating film formed on the conductive layer; and a pixel electrode formed on the insulating film, in which: the storage capacitor element is composed of the light-shielding film, the capacitor insulating film, and the conductive layer; the conductive layer and the pixel electrode contact through an opening formed in the insulating film; and the capacitor insulating film, the conductive layer, and the pixel electrode are separately formed in each of pixels and are aligned at end surfaces thereof between the adjacent pixels.

The conductive layer formed on the capacitor insulating film is electrically connected to the pixel electrode so as to make a potential equal therebetween and the storage capacitor element composed of the light-shielding film, the capacitor insulating film formed on the light-shielding film, and the conductive layer formed on the capacitor insulating film is adapted thereto, so that a sufficient storage capacitor can be obtained without reducing an opening ratio.

Also, on the conductive layer, a flattening film formed of the insulating film is formed in order to prevent the defect in orientation of the liquid crystal due to the steps or unevennesses on the surface of the pixel electrode in a region through which a light is passed (region contributing to a display). Through the formation of the flattening film, since the step of the pixel electrode is formed on the light-shielding film, even if an uneven rubbing treatment is performed on the orientation film to cause the defect in orientation, it does not affect a display.

Note that, according to the present invention, the liquid crystal is sandwiched between a pair of substrates and the thin film transistor is used as a switching element for each pixel. The present invention can be adapted to all liquid crystal display devices including a liquid crystal display device connected to a driving circuit through a connector such as an FPC or a TAB, a liquid crystal display device in which a pixel portion and a driving circuit are integrally formed on the same substrate (hereinafter, referred to as integrally formed liquid crystal display device), a liquid crystal display device in which the driving circuit is formed in the integrally formed liquid crystal display device and the pixel portion is connected with a controller having a function of displaying an image, and a liquid crystal display device provided with a microcomputer for controlling the controller. Further, in this specification, all the liquid crystal display devices described above collectively refer to the semiconductor device.

BRIEF DESCRIPTION OF THE DRAWINGS

In the accompanying drawings.

FIGS. 5A and 5B are views for showing an embodiment of the present invention;

FIGS. 11A to 11D are views for showing an example of an electric appliance;

DETAILED DESCRIPTION OF THE PREFERRED EMBODIMENTS

In this embodiment mode, a description will be given of a structure of a pixel portion in a semiconductor device of the present invention.

Figure 2A:
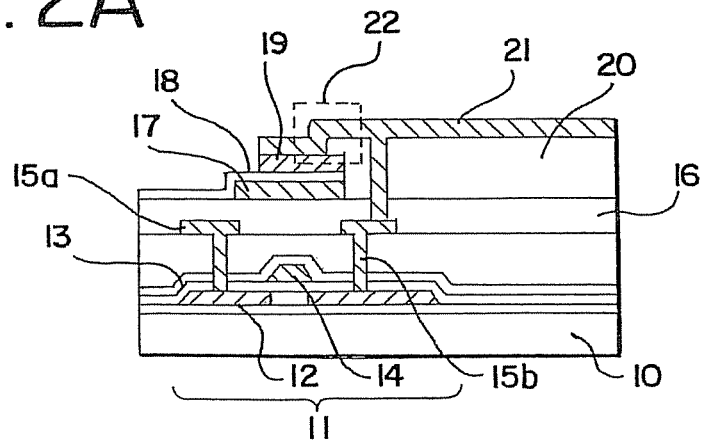
FIGS. 2A and 2B are views for illustrating a region functioning as a storage capacitor element according to the present invention.

The structure of the semiconductor device of the present invention is shown in FIG. 2A. A TFT 11 is formed on a substrate 10. The TFT includes a semiconductor layer 12 having at least a channel formation region and a source/drain region, a gate insulating film 13 formed on the semiconductor layer 12, and a gate electrode 14 formed on the gate insulating film 13, and further, a source wiring 15a and a drain wiring 15b which are used for connecting the respective TFT's are formed.

The source wiring 15a and the drain wiring 15b are respectively connected to regions (the source region and the drain region) added with an impurity element at a high concentration.

Also, an interlayer insulating film 16 is formed on the gate electrode 14, the source wiring 15a, and the drain wiring 15b, and a light-shielding film 17 for shielding the TFT (particularly, the channel formation region) from the light is formed on the interlayer insulating film 16.

On the light-shielding film 17, a capacitor insulating film 18 is formed. A conductive layer 19 is formed on the capacitor insulating film 18. After the conductive layer 19 is formed, a flattening film 20 made of an insulating material is formed, followed by a formation of a pixel electrode 21. The conductive layer 19 and the pixel electrode 21 are in contact with each other through a contact hole formed in the flattening film 20 and are formed so as to make their potentials equal. In this way, a structure is obtained in which a step (an end portion of the light-shielding film 17) 22 caused by covering the light-insulating film 17 with the insulating film is positioned not in a region through which a light passes but on the light-shielding film 17. A pixel structure disclosed in the present invention is characterized in that the storage capacitor is composed of the capacitor insulating film 18 formed on the light-shielding film 17 and the conductive layer 19 formed on the capacitor insulating film 18.

Further, it is characterized in that disturbance in orientation of the liquid crystal due to a step in a region through which a light passes is suppressed.

Note that, the light-shielding film 17 may have a single-layer structure or a laminate structure using an element selected from the group consisting of Al, Ti, W, and Cr or an alloy material mainly containing the above element.

Also, the capacitor insulating film 18 may be composed of an inorganic insulating film such as a silicon oxide film, a silicon nitride film, a silicon nitride oxide film, or a silicon oxynitride film, which is formed by a CVD method, a sputtering method, etc. Here, it is also possible to employ an organic insulating film as long as it has characteristics of high dielectric constant and low leak current.

Further, the conductive layer 19 is formed by using an element selected from the group consisting of Al, Ti, and W or an alloy material mainly containing the above element, or ITO. Note that, when a priority is given to the light-shielding property for the TFT, the conductive layer 19 may be formed by using an element selected from the group consisting of Al, Ti, and W or an alloy material mainly containing the above element, which is high in the light-shielding property.

Also, the interlayer insulating film 16 formed on the drain wiring 15b and the light-shielding film 17 formed on the interlayer insulating film 16 can be used to constitute the storage capacitor.

In addition, the flattening film 20 composed of the insulating film may be formed by using a silicon oxide film, a silicon oxynitride film, a silicon nitride oxide film, a silicon nitride film, or other inorganic insulating films, for example, made of a solution application system material called SOG (spin on glass). Alternatively, it may be composed of an organic insulating film formed by using at least one kind of material selected from the group consisting of acrylic resin and polyimide.

According to the present invention, the conductive layer 19 is formed to make the pixel electrode and the conductive layer have the same potential, so that the whole region where pixel electrode overlaps the upper light-shielding film can serve as the storage capacitor element. Therefore, as compared with the conventional structure shown in FIG. 1B, the storage capacitor can be made larger.

Figure 1A:
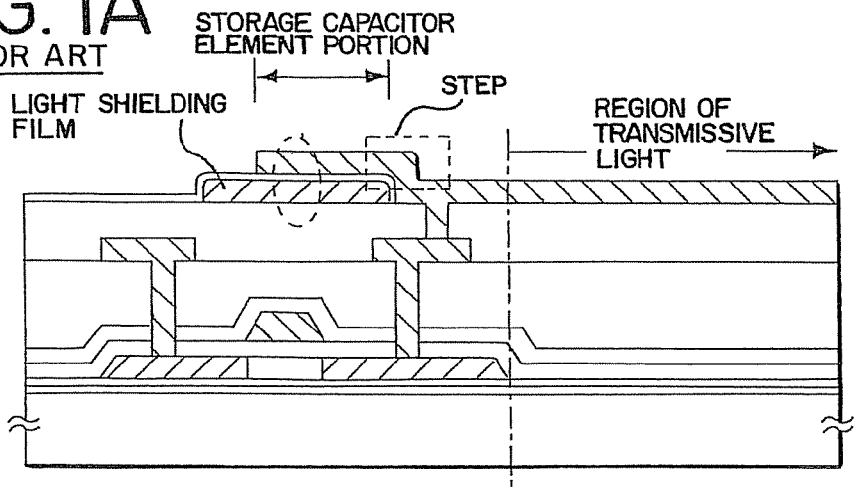
FIGS. 1A to 1C are views for illustrating a conventional storage capacitor element.
Figure 1B:
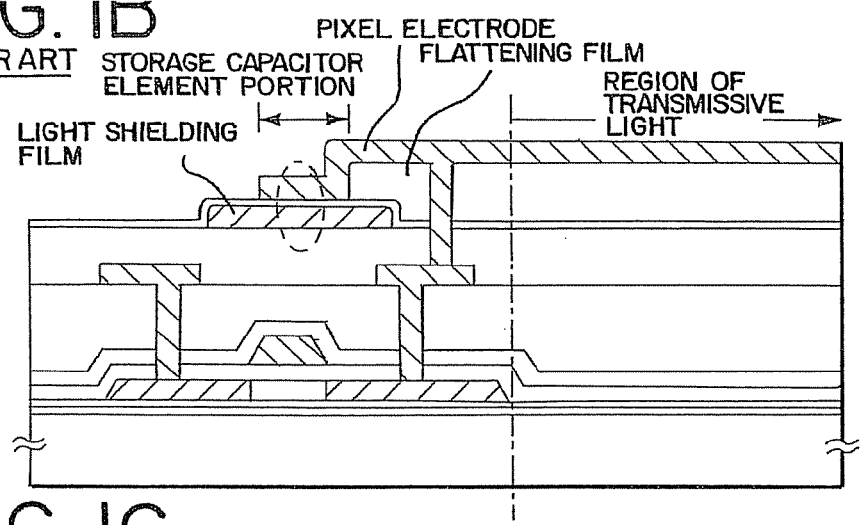
Figure 1C:
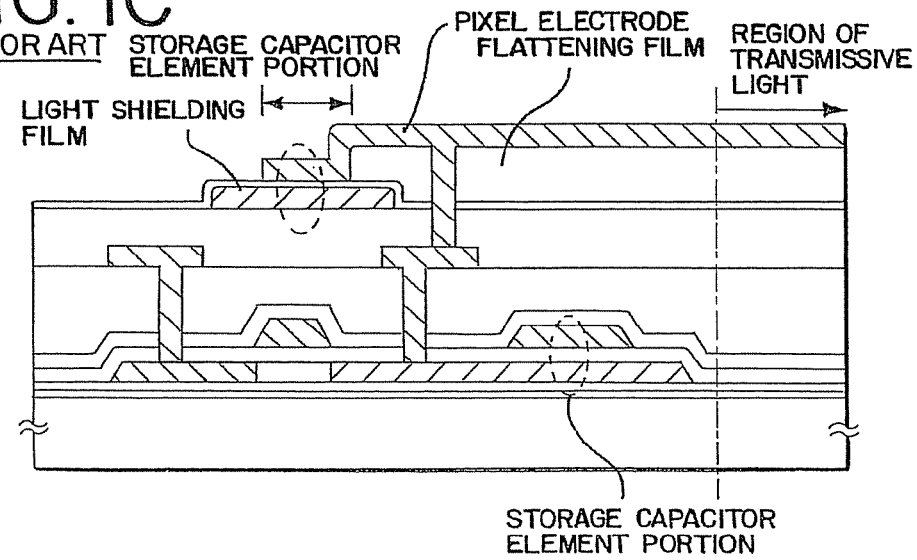
Figure 2B:
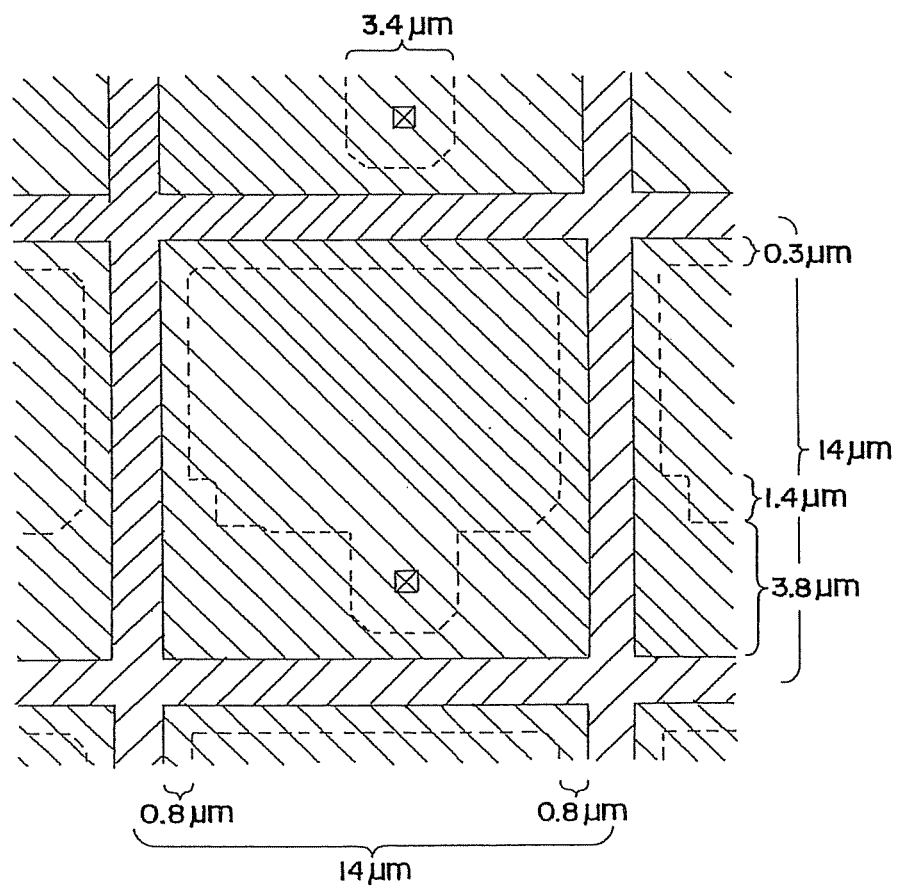
Figure 3A:
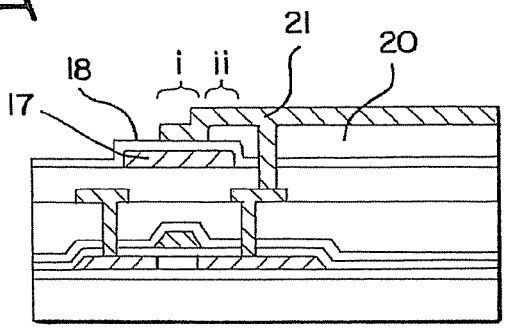
FIGS. 3A and 3B are views for illustrating a region functioning as the conventional storage capacitor element.
Figure 3B:
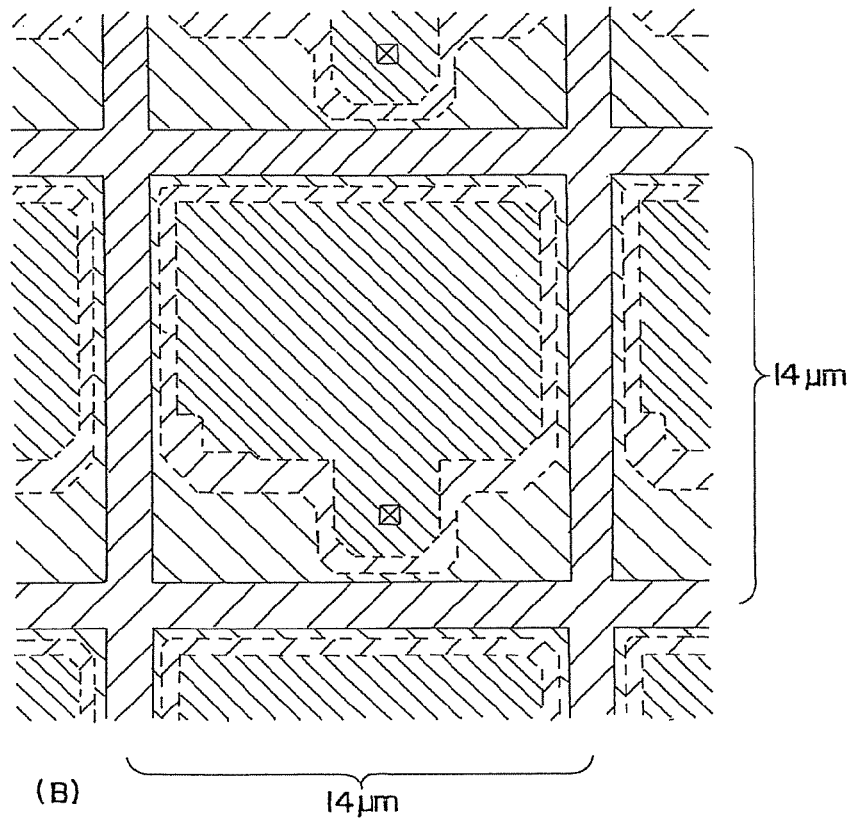

As an example of the present invention, an actual view of a mask is shown in FIG. 2B (here, in one pixel designed in a size of 14 μm×14 μm, the light-shielding film and the pixel electrode (ITO) are shown for simplicity). Here, assuming that calculation is performed on an area of the region serving as the storage capacitor element composed of the upper light-shielding film, the capacitor insulating film, and the conductive layer (at the same potential as the pixel electrode), the area becomes 63.645 μm². In the conventional structure having no conductive layer as shown in FIG. 1B, an area of the region actually serving as the storage capacitor element is considerably small in comparison with the present invention, even if the upper light-shielding film and the pixel electrode are overlapped. In FIG. 3B, a region serving as the storage capacitor element is indicated by the broken line. In this case, similarly to FIG. 2B, in one pixel designed in a size of 14 μm×14 μm, the light-shielding film and the pixel electrode (ITO) are shown for simplicity. An area of the region serving as the storage capacitor element is 34.905 μm² in the conventional structure. As compared with the present invention, the present invention can increase the area serving as the storage capacitor element up to 1.82 times the conventional one without reducing the opening ratio.

As described above, the step formed in a region through which a light passes in the pixel electrode can be eliminated without additional steps. As a result, the steps or unevennesses of the pixel electrode do not hinder the sufficient rubbing treatment for the orientation film, so that it is possible to suppress the phenomenon of leak light due to the disturbance in orientation of liquid crystal. Further, as compared with the conventional structure having no conductive layer, by forming the conductive layer 19, the capacitor approximately twice the conventional one can be secured without reducing the opening ratio, so that the present invention is effective.

Note that, the present invention can be adapted without being limited to the TFT described in this embodiment mode.

Embodiment 1

A method of manufacturing an active matrix substrate is explained in Embodiment 1 using FIGS. 4A to 6. A substrate on which driver circuits, and a switching element in the pixel portion (the pixel TFTs) and storage capacitor elements are formed is referred to as an active matrix substrate in Embodiment 1, for convenience.

First, a substrate made from glass, such as barium borosilicate glass or aluminum borosilicate glass, typically Corning Corp. #7059 glass, #1737 glass, and the like is used as a substrate in Embodiment 1. Note that quartz substrates, silicon substrates, and metallic substrates and stainless steel substrates on which an insulating film is formed may also be used as the substrate. Further, plastic substrates having heat resistant properties capable of withstanding the processing temperatures of Embodiment 1 may also be used. A quartz glass substrate is applied in Embodiment 1.

A lower portion light shielding film 101 is formed next on the quartz substrate 100. The lower portion light shielding film 101 has a single structure or a laminate structure that is formed out of conductive materials composed of one element selected from Ta, W, Cr, and Mo that having heat resistant properties capable of withstanding the processing temperatures of this embodiment, or conductive materials composed of said elements-based alloy, at a film thickness on the order of 300 nm. The lower portion light shielding film 101 functions as a gate wiring, so that it is also referred to as a gate wiring. A 75 nm thick crystalline silicon film is formed in Embodiment 1, and after forming a 150 nm thick WSix film (where x=2.0 to 2.8), unnecessary portions are etched, the lower portion light shielding film 503 is formed. Note that although a single layer structure is used as the lower portion light shielding film (the gate wiring) 101 in Embodiment 1, a laminate structure having two or more layers may also be used. The interlayer insulating film may be formed before that the lower portion light shielding film 101 is formed in order to prevent the dispersion of pollution materials.

A base insulating film 102 is then formed on the substrate 100 and the lower portion light shielding layer (gate wiring) 101 having a film thickness of 10 to 650 nm (preferably between 50 and 600 nm) from an insulating film such as a silicon oxide film formed by LPCVD at high temperature of 800° C., a silicon nitride film, or a silicon oxynitride film. A single layer structure is used as the base insulating film 102 in Embodiment 1, but a laminate structure in which two or more layers of the insulating films are laminated may also be used to prevent the diffusion of pollution materials. A silicon oxynitride film made formed by plasma CVD using $SiH_4$, $NH_3$, and $N_2O$ as reactant gas is formed as the base insulating film 102 in Embodiment 1. The silicon oxynitride film (Si=32%, O=27%, N=24%, H=17%) is formed at 400° C. having a film thickness of 580 nm.

An amorphous semiconductor film 103 is formed next on the base insulating film 102. (FIG. 4A) An amorphous semiconductor film 103 is formed out of a semiconductor film having an amorphous structure with a thickness of 25 to 200 nm (preferably between 30 and 100 nm) by a known means such as sputtering, LPCVD or plasma CVD. There are no limitations placed on the semiconductor film material, but it is preferable to form the semiconductor film from silicon, a silicon germanium (SiGe) alloy, or the like.

Thermal crystallization using a catalyst (metal element) such as nickel is then performed, crystallizing the semiconductor film. Further, in addition to thermal crystallization using a catalyst such as nickel, a known crystallization process (such as laser crystallization or thermal crystallization) may also be performed in combination. An aqueous nickel acetate solution (per weight concentration 10 ppm, volume 5 ml) is applied to the entire surface of the film by spin coating to form catalytic element contained layer, and the heat treatment is performed thereon for 12 hours at a temperature of 600° C. in a nitrogen atmosphere.

Further, the crystallization may be executed by performing the laser crystallization method together with the thermal crystallization method adding the catalytic element. If a laser crystallization method is also applied, a gaseous state laser, a solid laser of a pulse oscillation laser or a continuous oscillation can be used. Examples of gaseous state lasers are excimer lasers, Ar lasers, Kr lasers, while YAG lasers, $YVO_4$ lasers, YLF lasers, $YAlO_3$ lasers, glass lasers, ruby lasers, alexandrite lasers, and Ti: sapphire lasers, may be used as solid state lasers. If these lasers are used, a method in which a laser beam emitted from a laser oscillator is condensed into a linear shape, rectangular shape or elliptical shape by an optical system may be used. Conditions for crystallization may be suitably et by the operator, but the pulse oscillation frequency is set to 300 Hz and the laser energy density is set to from 100 to 800 mJ/cm² (typically between 200 and 700 mJ/cm²) if an excimer laser is used. Further, the second harmonic is utilized if a YAG laser is used, the pulse oscillation frequency is set to form 1 to 300 Hz, and the laser energy density is preferably set between 300 and 1000 mJ/cm² (typically from 350 to 800 mJ/cm²). The laser beam, condensed into a linear shape with a width of 100 to 1000 μm, for example 400 μm, may then be irradiated over the entire substrate surface. In the case that a $YVO_4$ laser is used, the laser light emitted from the continuous oscillation a $YVO_4$ laser of 10 W output is converted by the non-linear optical elements, and harmonic is emitted by insert $YVO_4$ crystals and the non-linear optical elements in a laser oscillator. Furthermore, it is necessary for the energy density to be set to from 0.01 to 100 MW/cm² (preferably from 0.1 to 10 MW/cm²) if an $YVO_4$ laser is used. It is then preferable to irradiate the laser light by moving a stage relative to the laser beam at a speed of 0.5 to 2000 cm/s.

Figure 4A:
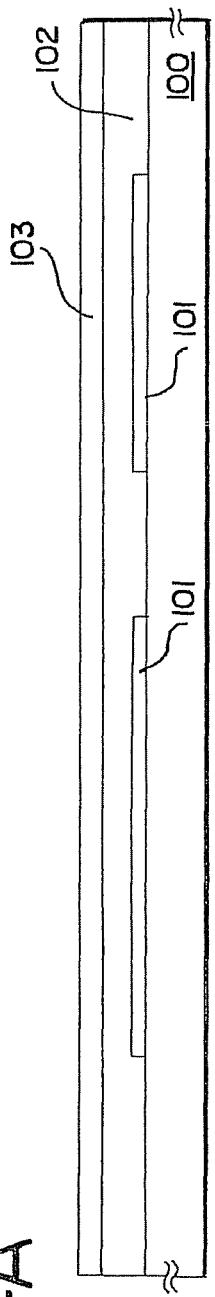
FIGS. 4A to 4C are views for showing an embodiment of the present invention.
Figure 4B:
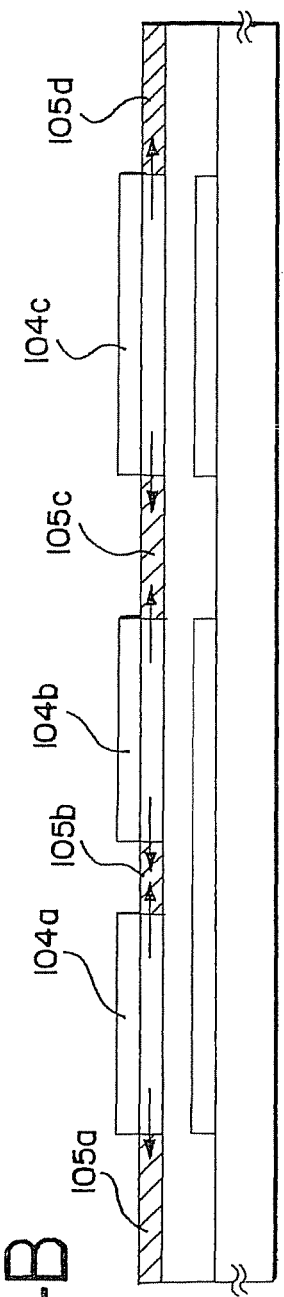

In the case that the catalytic element is used for the crystalline steps of the semiconductor film, gettering is then performed in order to remove from, or reduce the concentration of, the metal element used in order to promote crystallization in semiconductor layers that become active regions. The method disclosed in Japanese Patent Application Laid-open No. Hei 10-270363, and the method in which the chemical oxide film is formed on the crystalline semiconductor film by processing using ozone water, the gettering site containing rare gas is formed on the chemical oxide film, and the heat treatment is performed, thereby, the catalytic element is removed to the gettering site may be applied for gettering. A silicon oxide film having a film thickness of 50 nm is formed as a mask in Embodiment 1, patterning is performed, and masks 104a to 104c having desired shapes are obtained. A periodic table group 15 element (typically phosphorous (P)) is then selectively injected into the semiconductor film, and the impurity regions 105a to 105 are formed. As the doping method of the impurity elements, one kind or plural kinds selected from the following method may be used; the plasma doping method, the ion injection method, and ion shower doping method. By performing a heat treatment, the catalyst element can thus be removed from the semiconductor layers that becomes an active layer to the impurity regions 105a to 105d, or reduced in concentration to a level at which it does not influence the semiconductor characteristics of the semiconductor layers. A lowered off current value, and high electric field mobility can be obtained due to good crystallinity for TFT's having active regions thus manufactured. Good characteristics can thus be achieved. (FIG. 4B)

Etching of the crystalline semiconductor film is then performed to form semiconductor layers. The insulating film is formed, and heat treatment processing is performed in order to increase the crystallinity of the semiconductor film. It is preferable to thermally oxidize an upper portion of the semiconductor film. Heat treatment is performed using an annealing furnace after forming a 20 nm thick silicon oxide film by using an LPCVD apparatus. Upper portions of the semiconductor layers are oxidized by this process. If the silicon oxide film and the oxidized portions of the semiconductor film layers are then etched, semiconductor layers 106 to 108 having increased crystallinity can be obtained.

Doping of a small amount of an impurity element (boron or phosphorous) may also be performed after forming the semiconductor layers 106 to 108 in order to control the TFT threshold value.

Figure 4C:
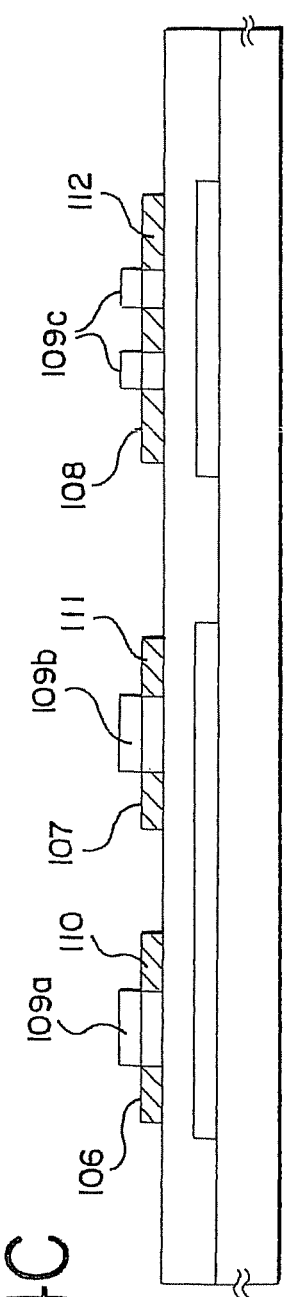

The resist masks 109a to 109c were formed in advance, and an impurity element to give an n-type is selectively doped onto the semiconductor layers by performing the second doping process. A periodic table group 15 element, typically, phosphor (P) and arsenic (As) may be used as an impurity element to give the n-type. Herein, phosphor (P) is employed. Impurity elements are doped in the selected semiconductor layer because the masks 109a to 109c are formed, thereby, the high concentration impurity regions 110 to 112 are formed. Impurity elements imparting an n-type (hereinafter referred to as n-type impurity elements) are doped in the high concentration impurity regions 110 to 112 at a concentration range from $1 \times 10^{18}$ to $1 \times 10^{20}$/cm$^3$. (FIG. 4C).

A first gate insulating film 113 is formed next, covering the semiconductor layers 106 to 108. The first gate insulating film 113 is formed by an insulating film containing silicon with a thickness of 20 to 150 nm using plasma CVD or sputtering. A silicon oxynitride film having a film thickness of 35 nm (composition ratio: Si=32%; O=59%; N=7%; H=2%) is formed using plasma CVD in Embodiment 1. The gate insulating film is of course not limited to a silicon oxynitride film, and other insulating films containing silicon may also be used.

Further, when using a silicon oxide film, it can be formed by plasma CVD with a mixture of TEOS (tetraethyl orthosilicate) and O$_2$, at a reaction pressure of 40 Pa, with the substrate temperature set to from 300 to 400° C., and by discharging at a high frequency (13.56 MHz) electric power density of 0.5 to 0.8 W/cm$^2$. Good characteristics as a gate insulating film can be obtained by subsequently performing thermal annealing at a temperature of 400 to 500° C. respect to the silicon oxide film that is thus manufactured.

The impurity region may be loaned by doping impurity elements after the gate insulating film 113 is formed.

The conductive film having heat resistance property and having 100 to 500 nm in thick is formed after that the contact hole that connects the semiconductor layer to wirings for connecting electrically to each TFT, and the contact hole that connects gate electrode to the gate wiring 101 are formed. In this embodiment, W film may be formed to have a thickness of 400 nm by the sputtering method by using W as a target, or may be formed by the thermal CVD method by using tungsten hexafluoride (WF$_6$).

The conductive film is not especially limited to W, it may be formed from an element selected from the group consisting of Ta, W, Ti, Mo, Al, Cu, Cr, and Nd, from an alloy material having one of these elements as its main constituent, or from a chemical compound of these elements. Further, a semiconductor film, typically a crystalline silicon film into which an impurity element such as phosphorous is doped, may also be used, as may an AgPdCu alloy. In this embodiment, although the conductive film has a single structure, the conductive film may also have a laminated structure having two or more layers. In addition, triple structure in which a conductive film having low heat resistance such as Al is sandwiched by conductive films having high heat resistance.

The resist mask (not shown in the figures) are formed next using photolithography, and an etching process is performed in order to form electrodes and wirings. An ICP (inductively coupled plasma) etching method is used in Embodiment 1, and the etching conditions include: a gas mixture of CF$_4$, Cl$_2$, and O$_2$ is used as an etching gas; the gas flow rates are set to 25:25:10 sccm, respectively; and a plasma is generated by applying a 500 W RF electric power (13.56 MHz) to a coil shape electrode at 1 Pa, thereby performing etching. A 150 W RF electric power (13.56 KHz) is also applied to the substrate side (test piece stage), effectively applying a negative self-bias voltage. Thus, the gate electrodes 114 to 116 and wirings 117 to 121 are formed. (FIG. 5A)

Next, the first insulating film 122 to cover the electrodes 114 to 116 and the wirings 117 to 121 is formed. The first interlayer insulating film 122 is formed out of the insulating film containing silicon to have a thickness of 100 to 200 nm by using the plasma CVD or the sputtering. In this embodiment, the oxynitride silicon film is formed to have a thickness of 150 nm by plasma CVD method. Of course, the first interlayer insulating film 122 is not limited to the oxynitride silicon film, another insulating film contain other silicon in single layer or lamination layer may be used.

If necessary, the semiconductor region containing low concentration impurity elements in the semiconductor layer using masks may be formed. For example, the selected semiconductor layer is exposed by using resist masks. The dosage is set from $1 \times 10^{13}$ to $5 \times 10^{14}$/cm$^2$, and doping is performed at an acceleration voltage of 5 to 80 keV. A periodic table group 15 element, typically phosphorous (P) or arsenic (As) is doped. Thus, the low concentration impurity region can be formed in the selected region of the semiconductor layer. The n-type conductivity imparting impurity element is added to the low concentration impurity regions at a concentration range of $1 \times 10^{18}$ to $1 \times 10^{20}$ cm/$^3$.

Heat treatment is performed next, recovering crystallinity of the semiconductor layers, and performing activation of the impurity elements added to the respective semiconductor layers. Thermal annealing using an annealing furnace is performed for the heat treatment process. Thermal annealing may be performed at a temperature of 400 to 1000° C. in a nitrogen atmosphere having an oxygen concentration equal to or less than 1 ppm, preferably equal to or less than 0.1 ppm. Activation process is performed by heat treatment for 30 minutes at 950° C. in Embodiment 1. Note that, in addition to thermal annealing, laser annealing using a laser such as a YAG laser, and rapid thermal annealing (RTA) can also be performed. Further, the heat treatment process may be performed before that the first interlayer insulating film is formed. If the wiring material is weak against heat, it is preferable to perform the heat treatment after the first interlayer insulating film is formed to protect the wirings as Embodiment 1.

Hydrogenation processing can be performed if heat treatment is performed (at a temperature of 300 to 550° C. for 1 to 12 hours). This process is one of terminating dangling bonds in the semiconductor layers by hydrogen contained in the first interlayer insulating film 122. The semiconductor layers can also be hydrogenated, of course, irrespective of the presence of the first interlayer insulating film. As another means for hydrogenation, plasma hydrogenation (using hydrogen excited by a plasma) or heat treatment for 1 to 12 hours at 300 to 450° C. within an atmosphere containing hydrogen of 3 to 100% may also be performed.

The second interlayer insulating film 123 is formed on the first interlayer insulating film 122 from the inorganic insulating film materials or the organic insulating materials. As the second interlayer insulating film 123, planarizing surface film is preferably used. A known method to improve the planarization, for example, polishing steps referred to as CMP (chemical polishing) may be used. As the second interlayer insulating film, an acrylic resin film is formed to have a thickness of 1 μm, and a portion of the first interlayer insulating film formed on the gate electrode, the source wiring, and the drain wiring is exposed by etching. In this embodiment, although the first interlayer insulating film and the second interlayer insulating film are formed, it can be a single layer structure. In this case, the planarizing film is preferably used.

In the case that the retention capacitor element is formed at the portion of drain wiring, the interlayer insulating film, and the light shielding film that is formed later, the interval between the light shielding film and the drain region may be reduced to make thin the thickness of the interlayer insulating film by using the CMP.

The upper portion light shielding film 124 is formed in desired shape on the second interlayer insulating film 124 by patterning an element selected from the group consisting of Al, Ta, W, Ti, and Cr, or an alloy material having one of these elements as its main constituent. The upper portion light shielding film is provided to be mesh to shield the light except the opening portion. The light shielding film 125 is formed at the driver circuit.

Subsequently, the insulating film (hereinafter referred to as the capacitor insulating film) made from the nitride-oxide silicon or the oxynitride silicon film is formed to have a thickness of 50 to 100 nm. Since the leak current of the capacitor insulating film become large in parallel with that the dielectric constant become high if there is a high proportion of nitride, the content ratio is set about 1:8 to 2:1, thereby the capacitor insulating film is formed to have a thickness of 50 to 100 nm.

The conductive film is formed from an element selected from the group consisting of Al, Ta, and W, an alloy material having one of these elements as its main constituent or ITO. After that, etching is performed to be a desired shape by a known method, and the upper portion light shielding films 124, 125, the capacitor insulating film 126, 127, the conductive film 128 and 129 are formed.

Next, the film (hereinafter referred to as the planarizing film) 130 is formed so that the region where the light is permeated of the pixel electrode is planarized by using the silicon oxide film and the insulating film such as polyimide and acrylic. The opening portion for connecting the pixel electrode and the conductive film is formed, and in addition, the contact hole for connecting the pixel electrode to the drain electrode is formed on the planarizing film 130, the interlayer insulating film 122, and 123. The pixel electrode 131 is formed to have a thickness of 100 nm by using the transparent conductive film (ITO). Thus, the potential of the pixel electrode 131 and the conductive layer 128 become the same. In the forming step of the pixel electrode, the extraction electrode 132 in the driver circuit is formed.

Figure 6:
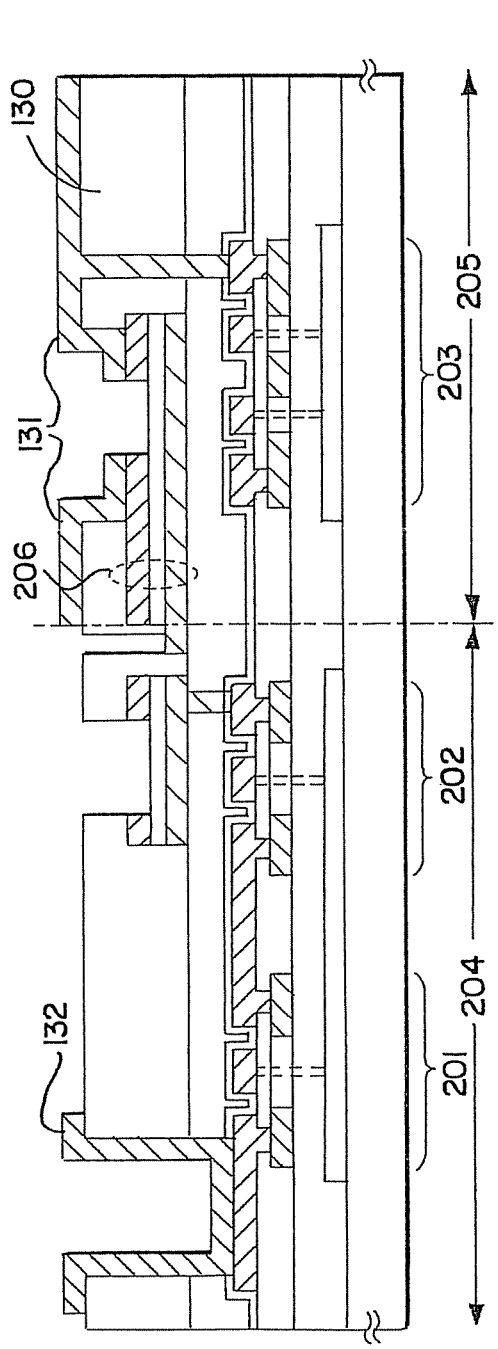
FIG. 6 is a view for showing an embodiment of the present invention.

As described above, the retention capacitor element can be formed that is composed of the upper light shielding film 124, the capacitor insulating 126, and the conductive film 128 (having the same potential with the pixel electrode 131). (FIG. 6)

As the present invention, forming the conductive layer 128 on the capacitor insulating film 126 makes it possible to expansion of the region where the storage of electric charge is possible as the retention capacitor element up to about two times.

Next, the conductive film 128 is etched by using the pixel electrode 131 as masks to cut the sequence with the adjust pixels thereby every pixel is independent.

As mentioned above, the active matrix substrate is completed on which the driver circuit 204 formed out of NMOS circuit of the n-channel TFT 201 and 202, and the pixel portion 205 having a pixel TFT 203 are formed on the same substrate.

At the pixel portion, the retention capacitor 206 composed of the upper light shielding film 124, the capacitor insulating film 126, the conductive layer 128 (having the same potential with the pixel electrode 131) is formed.

Since the gate electrode, source wiring, and the drain wiring are formed by the same step, the active matrix substrate formed by this means can reduce the number of steps than the conventional one. Therefore, the improvement of yield and the reduction of costs can be realized. Further, since the physical interval between the upper light shielding film and the semiconductor film is reduced, it is possible to prevent the leak current due to the light leak and the excessive diffraction. The source wiring is connected to the semiconductor film directly to minimize the number of the contact hole thereby the opening ratio can be improved when the liquid crystal display device is manufactured.

Embodiment 2

Figure 7:
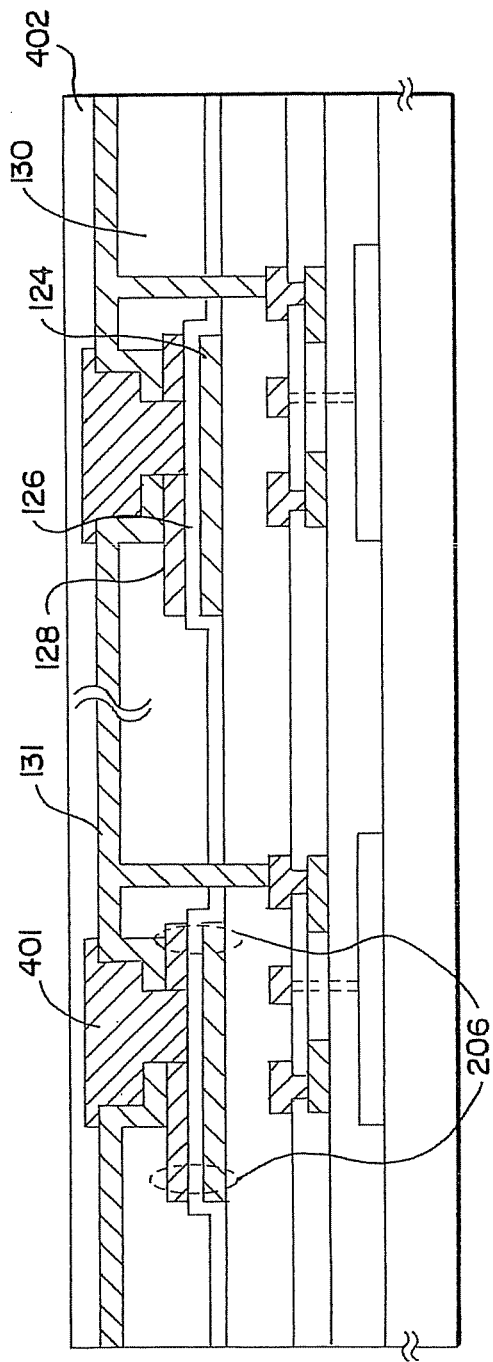
FIG. 7 is a view for showing an embodiment of the present invention.

In Embodiment 2, the manufacturing method of the semiconductor device of different structure from Embodiment 1 is described with reference to FIG. 7.

The pixel electrode 131 electrically connected with the conductive layer 128 is formed on the planarizing film 130 according to Embodiment 1. Then, the large level difference formed between the adjoining pixels which are generated by the light shielding film 124 formed on the second interlayer insulating film 123, the capacitor insulating film 126, the conductive layer 128, and pixel electrode 131 is planarized with the insulating film 401 which consists of acrylics, polyimide and the like as shown in FIG. 7. Subsequently, although the alignment film 402 is formed, since the level difference between the adjoining pixels is buried and planarized by the insulating film 401, it is hard to produce unevenness on the alignment film 402 surface. Then, rubbing processing is performed and the substrate and opposite substrate in which TFT was formed using sealing material (sealing agent) are stuck. And liquid crystal is made to hold in the meantime, and an active matrix liquid crystal display is manufactured. In addition, since this cell construction process uses a known method, detailed explanation is omitted.

By forming an insulating film in concave portion on a substrate as mentioned above, and the difference of the unevenness of the active matrix substrate surface formed by laminating of the various material can be made small. In the case of the rubbing processing performed after forming alignment film, it is possible to minimum the rubbing irregularity, and the inferiority in alignment of liquid crystal can be made hard to generate.

Embodiment 3

Figure 8A:
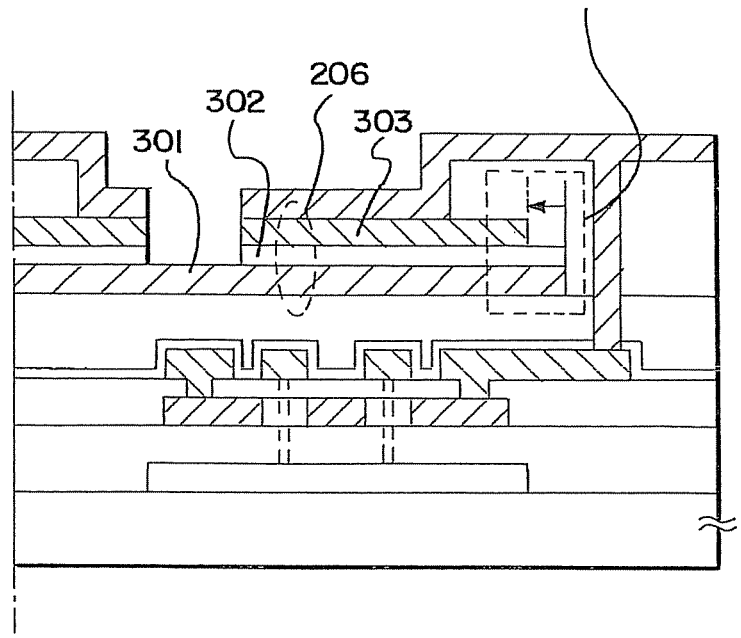
FIGS. 8A and 8B are views for showing an embodiment of the present invention.

In Embodiment 3, the manufacturing method of semiconductor device of different structure from Embodiment 1 with reference to FIG. 8.

The light shielding film 301, the capacitor insulating film 302, and the conductive layer 303 according to Embodiment 1. Then, shown by the arrow of FIG. 8A, the electric conduction layer 303 is etched so that it becomes inside a little from the light shielding film 301 and the capacitor insulating film 302. The etching is performed by using masks, or over etching may be performed. It can prevent the generation of leak current due to the conductive layer 303 being contact with the light shielding film 301.

Figure 8B:
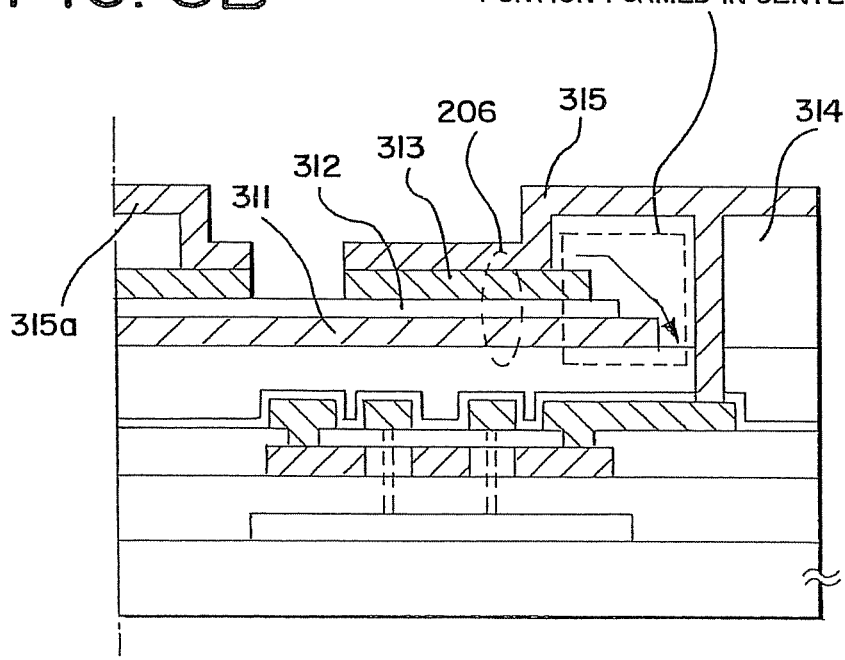

Furthermore, by carrying out over etching the light shielding film 311, the capacitor insulating film 312, and the conductive layer 313 in this order so as to be in a staircase order as shown in FIG. 8B. By carrying out etching using a mask, laminating can be made gently-sloping and the level difference and unevenness of pixel electrode 315 which are formed after forming the planarized film 314 can be reduced further. In addition, 315a is pixel electrode of the adjoining pixel.

As described above, the liquid crystal display device that has a sufficient retention capacitor, and that can perform a good display can be realized.

Embodiment 4

The retention capacitor element made from the conductive layer formed to have a same potential with the light shielding film, the capacitor insulating film, and the pixel electrode that are disclosed in the present invention can be formed on the light shielding film that shield the light except TFT as shown in Embodiment 1. In this embodiment, one example is described with reference to FIGS. 9 and 10.

The insulating film (not illustrated) such as the silicon oxide film, the silicon nitride film, the silicon oxynitride film are formed on the substrate 50, and the conductive film is formed to form the gate electrode and patterned to obtain the gate electrodes 51a to 51c. The conductive film from an element selected from the group consisting of Ta, Ti, W, Mo, Al or conductive film having one of these elements as its main constituent may be used. A substrate made from glass, such as barium borosilicate glass or aluminum borosilicate glass, quartz substrates, single crystalline substrate, and metallic substrates and stainless steel substrates on which an insulating film is formed may also be used as the substrate. Further, plastic substrates having heat resistant properties capable of withstanding the processing temperatures of Embodiment 4 may also be used.

The gate insulating films 52a and 52b are formed. The gate insulating film may have a single structure or a lamination structure composed of the silicon oxide film, the silicon nitride film, the silicon oxynitride film.

Figure 9A:
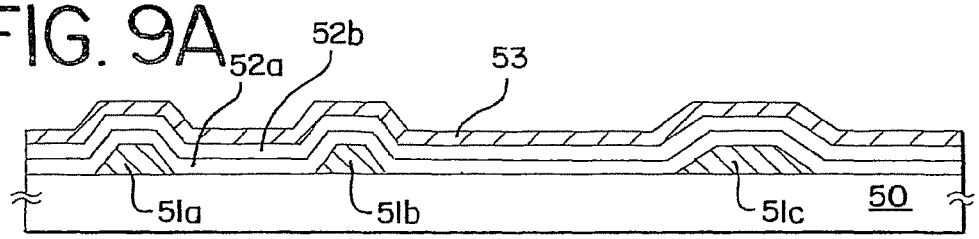
FIGS. 9A to 9D are views for showing an embodiment of the present invention.

The amorphous silicon film 53 is formed to have a thickness of 10 to 150 nm by thermal CVD method, plasma CVD method, LPCVD method, evaporation method, or sputtering method as an amorphous semiconductor film. Since the gate insulating film 52 and the amorphous silicon film 53 can be formed by a same deposition method, both may be formed continuously. The continuous formation does not expose to the air, so that pollution of the surface can be prevented and a scattering or variation in the characteristics or the threshold voltage of TFTs to be manufactured can be reduced. (FIG. 9A)

Figure 9B:
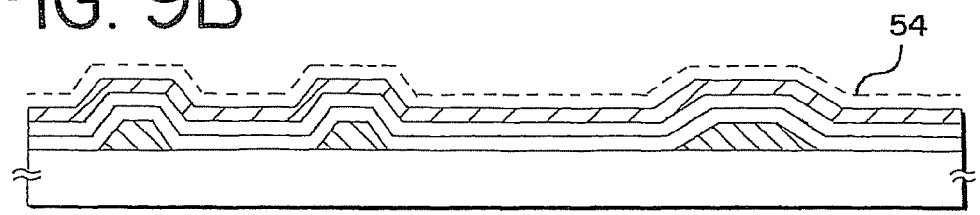

Then, a catalytic element that promotes crystallization is applied to the amorphous silicon film 53 to form a catalytic element containing layer 54. Thereafter, heat treatment is performed to form a crystalline silicon film. (FIG. 9B)

If a laser crystallization method is also applied, a gaseous state laser, a solid laser of a continuous oscillation or a pulse oscillation laser can be used. Examples of gaseous state lasers include continuous oscillation or pulse oscillation excimer lasers, Ar lasers, Kr lasers, while YAG lasers, $YVO_4$ lasers, YLF lasers, $YAlO_3$ lasers, glass lasers, ruby lasers, alexandrite lasers, and Ti: sapphire lasers, may be used as solid state lasers. In crystallizing a semiconductor film that has an amorphous structure, it is preferred to choose a continuous wave solid-state laser and use the second harmonic to fourth harmonic of the fundamental wave in order to obtain crystals with a large grain size. Typically, the second harmonic (532 nm) or third harmonic (355 nm) of a Nd:$YVO_4$ laser (fundamental wave: 1064 nm) is employed.

When the crystallization step is completed, the insulating film 55 to protect the crystalline silicon film (the channel formation region) at the later impurity doping step is formed to have a thickness of 100 to 400 nm. The insulating film is formed so that the crystalline silicon film is not directly exposed to plasma during addition of an impurity, and so that it is possible to have delicate concentration control of the impurity.

Figure 9C:
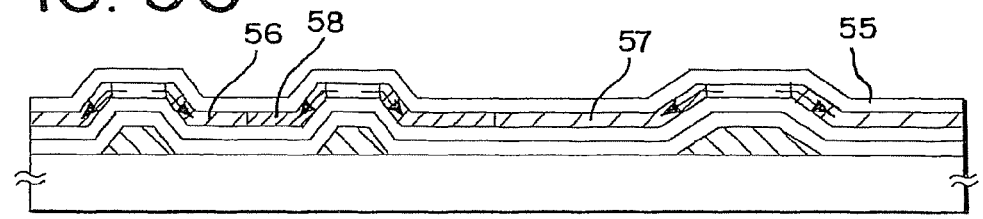

The highly doped n-type impurity element regions 56, 57 (source or drain region later) where impurity elements imparting n-type is doped to the crystalline silicon film that become an active layer of n-channel TFT later by using a resist mask. Subsequently, the highly doped p-type impurity element region 58 (source or drain region later) where impurity elements imparting p-type is doped to the crystalline silicon film that become an active layer of p-channel TFT later by using a resist mask. In the n-channel TFT and the p-channel TFT, low doped impurity element region (LDD region) may be formed. (FIG. 9C)

The activation process of the impurity element that is doped to the crystalline silicon film is performed. In parallel with the activation process, gettering the catalyst element applied to the silicon film at the crystalline step is performed. The heat treatment is performed at atmosphere of 5 ppm oxide concentration at a temperature of 450 to 950° C.

Figure 9D:
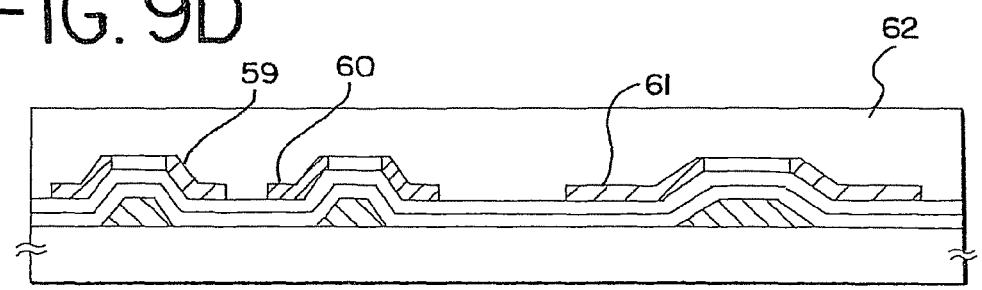

The insulating film on the crystalline silicon film is removed, and the crystalline silicon film is patterned to form in a desired shape, thereby the semiconductor layers 59 to 61 is obtained. Next, the interlayer insulating film 62 is formed. The interlayer insulating film 62 is formed out of the insulating film such as the silicon oxide film, the silicon nitride film, and the silicon oxynitride film to have a thickness of 500 to 1500 nm. (FIG. 9D)

Figure 10A:
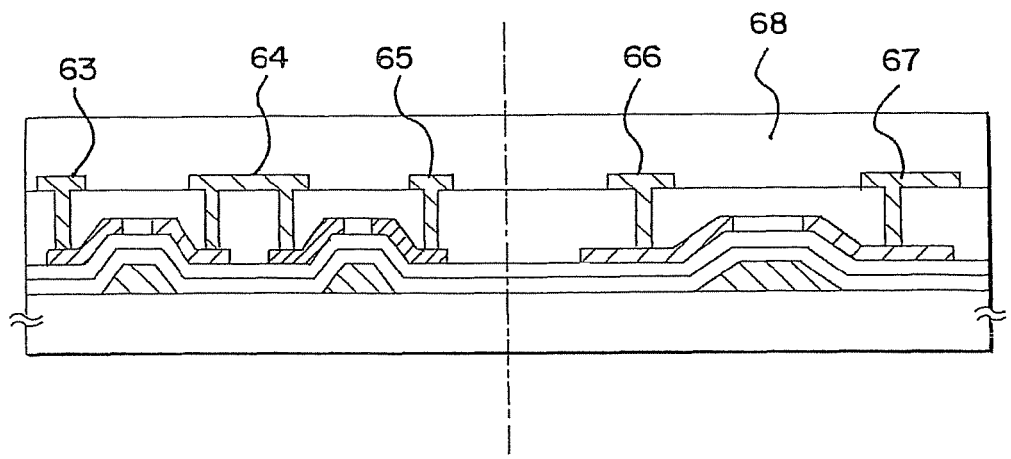
FIGS. 10A and 10B are views for showing an embodiment of the present invention.

The contact hole that reach the source or drain regions of each TFT is formed, and the wirings 63 to 67 are formed for connecting each TFT electrically. And the interlayer insulating film 68 to cover the wirings 63 to 67 is formed. (FIG. 10A)

The light shielding film 69 not to radiate the light to the TFT is formed. The light shielding film 69 is formed to have a thickness of 100 to 200 nm by using an element selected from the group consisting of Al, Ta, W, Ti, and Cr, materials having one of these elements as its main constituent, or the film having high light shielding property such as black resin and the like.

Thereafter, the capacitor insulating film 70 is formed on the light shielding layer 69. The capacitor insulating film 70 is formed by using either of the silicon oxynitride film or the nitride-oxide silicon film to have a thickness of 50 to 100 nm.

Next, the conductive film 71 is formed on the capacitor insulating film 70. The conductive layer 71 is formed by using an element selected from the group consisting of Al, Ta, W, Ti, and Cr, materials having one of these elements as its main constituent. The transparent conductive film (for example, ITO) can be used.

Figure 10B:
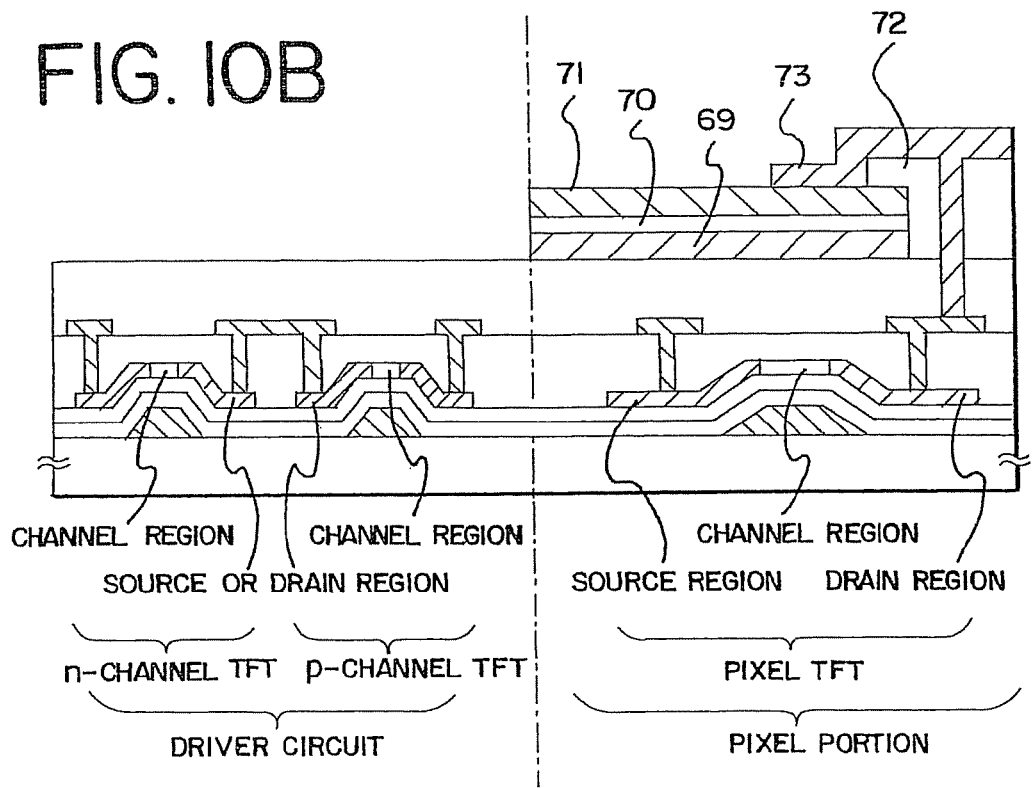

The planarizing film 72 is formed by using an insulating film for planarize the region where the light of the pixel electrode is transmitted. The planarizing film 72 is performing the planarization by forming the silicon oxide film to have the thickness of 100 to 200 nm, and by using CMP method (Chemical Mechanical Polishing). After the planarizing film 72 is formed, the contact hole to connect the conductive layer 71 and the pixel electrode is formed at the planarizing film 72, and the contact hole to connect the pixel electrode and the wiring 67 that become a drain electrode is formed at the planarizing film 72 and the interlayer insulating film 68, thereby the pixel electrode 73 is formed. After the pixel electrode 73, the conductive layer 71 is patterned and etched to cut the continuity to the conductive layer 71 formed in the adjoining pixels. (FIG. 10B)

By this means, the retention capacitor element composed of the light shielding film 69, the capacitor insulating film 70, and the conductive layer 71 having same potential as that of the pixel electrode 73 is formed. By forming the conductive layer 71, the overlap region of the light shielding film 69 and pixel electrode 73 can function as a retention capacitor element without futility.

Moreover, since the level difference of pixel electrode 73 is formed on the shading film 69 by forming the planarizing film 72 as the present invention, the alignment disorder and the leak of light due to the level difference and unevenness of pixel electrode 73 can be prevented.

As mentioned above, this invention can be adopted irrespective the shape of TFT.

Embodiment 5

In Embodiment 5, the manufacturing method of the semiconductor layer including the channel formation region, the source region, and the drain region of TFT by using the semiconductor (typically silicon) film (hereinafter a high temperature polysilicon film) that is obtained by performing heat treatment at high temperature in the semiconductor that has TFT and a retention capacitor element shown in Embodiment 1.

The lower light shielding film and base insulating film are formed, which function also as a gate wiring according to Embodiment 1 on a quartz substrate having high heat resistant. Then, an amorphous semiconductor film is formed on a base insulating film by a known method, such as the LPCVD method, the PCVD method, or the sputtering method.

Subsequently, the heat treatment is performed on the amorphous semiconductor film for 24 hours at 600° C. using a furnace to form the crystalline semiconductor film. In addition, although an oxide silicone film is formed on the semiconductor film surface in this crystallization processing, there is no problems because it is a very thin film removable by etching and the like.

The heat treatment is performed for forming a gate insulating film after removing the oxide film formed on the surface of the crystalline semiconductor film. The crystalline semiconductor film is heat treated at 900 to 1050° C., and an oxide film is formed on the surface of the crystalline semiconductor film. This oxide silicone film is used for a gate insulating film. The oxide silicone film is finally formed on the surface of crystalline semiconductor film by performing heat treatment on the crystalline semiconductor film to have thickness of 30 to 50 nm.

The crystal semiconductor film obtained by high temperature heat treatment has high crystallinity. By using the semiconductor film having higher degree of the electrical field effect movement with the semiconductor layer including the channel formation region, the source region, and the drain region is obtained, TFT with the outstanding characteristic can be realized. Moreover, the semiconductor device having high reliability can be realized by using this TFT for a circuit. This embodiment can be used by combining with Embodiments 1 to 4.

Embodiment 6

In this embodiment, a description will be given of an example in which, in a semiconductor device having the structure shown in Embodiment 1 which includes a thin film transistor and a storage capacitor element, a semiconductor layer including a channel formation region, a source region, and drain region of the thin film transistor is manufactured by using a crystalline semiconductor film obtained through laser light application.

According to the manner of Embodiment 1, a lower light-shielding film also serving as a gate line and a base insulating film are formed on a substrate. Subsequently, an amorphous semiconductor film is formed on the base insulating film by a well-known method such as an LPCVD method, a PCVD method, or a sputtering method. Here, employed as the substrate is a substrate made of glass such as barium borosilicate glass and aluminoborosilicate glass which are represented by Corning #7059 glass and #1737 glass manufactured by Corning Incorporated. Also, a quartz substrate, a single crystal silicon substrate, or a metal substrate or a stainless steel substrate with the insulating film formed on the surface thereof can be adopted. Further, a plastic substrate having a high heat resistance can be adopted.

Following this, the amorphous semiconductor film is irradiated with a laser light. As the laser to be used, a gas laser or a solid laser of continuous oscillation or pulse oscillation is used. As the gas laser, there is used an excimer laser, an Ar laser, a Kr laser, or the like. As the solid laser, there is used a YAG laser, a $YVO_4$ laser, a YLF laser, a $YAlO_3$ laser, a glass laser, a ruby laser, an alexandrite laser, a Ti: sapphire laser, or the like.

Note that, as the solid laser, there is applied a laser using crystal such as YAG, $YVO_4$, YLF, or $YAlO_3$ doped with Cr, Nd, Er, Ho, Ce, Co, Ti, or Tm. A fundamental wave of the laser concerned varies depending on a doped material and a laser light having the fundamental wave of around 1 μm is obtained. A harmonic with respect to the fundamental wave can be obtained by using a nonlinear optical element.

Upon crystallization of the amorphous semiconductor film, in order to obtain crystal with a large grain size, it is preferable that the solid laser capable of continuous oscillation is used and a second harmonic to a fourth harmonic with respect to the fundamental wave are applied. As a typical example thereof, the second harmonic (532 nm) or the third, harmonic (355 nm) of an Nd:$YVO_4$ laser (fundamental wave: 1064 nm) is applied.

Here, as an example, a method of performing the crystallization using the $YVO_4$ laser will be described. The laser light emitted from the $YVO_4$ laser of continuous oscillation with an output of 10 W is converted into the harmonic by the nonlinear optical element. Further, it is also possible that the YVO$_4$ crystal and the nonlinear optical element are put into a resonator to generate the harmonic. Then, after being shaped into a laser light preferably in the form of rectangle or ellipse on the irradiation surface through an optical system, the laser light is applied to the target body for processing. At this time, an energy density of about 0.01 to 100 MW/cm$^2$ (preferably, 0.1 to 10 MW/cm$^2$) is required. Then, a laser light is applied in such a manner that the semiconductor film is moved relative to the light at a speed of about 0.5 to 2000 cm/s.

The crystalline semiconductor film thus obtained through a laser light irradiation is high in crystallinity and a semiconductor film in which higher field effect mobility can be obtained is used for the semiconductor layer including the channel formation region, the source region, and the drain region. Thus, the TFT having superior characteristics can be attained, and further, by applying the TFT to the circuit, a semiconductor device with a high reliability can be realized. This embodiment can be implemented in combination with Embodiments 1 to 4.

Embodiment 7

Through the application of the present invention, various electric appliances can be completed in which an active matrix liquid crystal display device (liquid crystal display) is incorporated into a display portion.

As an example of the above-mentioned electric appliances, there can be given a projector (rear type or front type), a video camera, a digital camera, a head mounted display (goggle type display), a personal computer, a personal digital assistant (mobile computer, cellular phone, electronic book, etc.), or the like. An example thereof is shown in FIGS. 11A to 13C.

FIG. 11A shows a front type projector that includes a projection device 2601, a screen 2602, etc.

FIG. 11B shows a rear type projector that includes a main body 2701, a projection device 2702, a mirror 2703, a screen 2704, etc.

Note that, FIG. 11C is a view showing an example of structures of the projection devices 2601 and 2702 in FIGS. 11A and 11B. The projection devices 2601 and 2702 are composed of a light source optical system 2801, mirrors 2802 and 2804 to 2806, dichroic mirrors 2803, a prism 2807, a liquid crystal display device 2803, a phase difference plate 2809, and a projection optical system 2810. The projection optical system 2810 is constituted of an optical system including a projection lens. In this embodiment, a three-CCD type is shown by way of example, but there is put no particular limitation thereon. For example, a single-CCD type may be employed. Also, the performer may appropriately provide, in some midpoint of an optical path indicated by the arrow of FIG. 11C, an optical system such as an optical lens, a film having a polarization function, a film for adjusting a phase difference, or an IR film.

Also, FIG. 11D is a view showing an example of a structure of the light source optical system 2801 shown in FIG. 11C. In this embodiment, the light source optical system 2801 is constituted of a reflector 2811, a light source 2812, lens arrays 2813, 2814, a polarization conversion element 2815, and a condensing lens 2816. Note that, the light source optical system shown in FIG. 11D is only employed as an example, and there is put no, particular limitation thereon. For example, the performer may appropriately provide in the light source optical system the optical system such as the optical lens, the film having a polarization function, the film for adjusting a phase difference, or the IR film.

By using the present invention, the light applied to the thin film transistor can be shielded by the light-shielding film, so that an optical leak current can be suppressed even if a strong light adopted in the projector is irradiated. In addition, the capacitor element having a sufficient storage capacitor is formed, which makes it possible to hold a signal and to prevent an uneven display. As a result, a definite display with a high quality can be achieved. Moreover, a sufficient capacitor element can be formed without reducing an opening ratio, so that low power consumption can be realized in the light source while maintaining sufficient luminance.

Figure 12A:
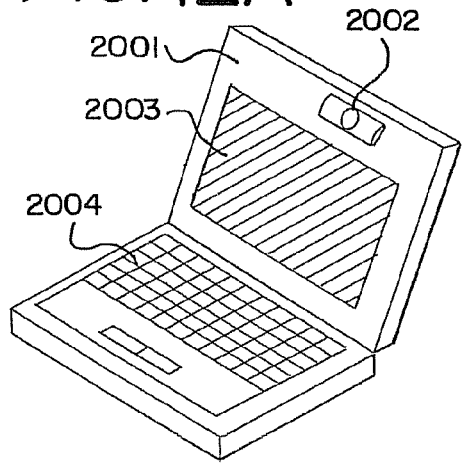
FIGS. 12A to 12F are views for showing an example of electric appliances.

FIG. 12A shows a personal computer that includes a main body 2001, an image input portion 2002, a display portion 2003, a key board 2004, etc. It is possible that the liquid crystal display device of the present invention is adapted to the display portion 2003 to thereby complete the personal computer. FIG. 12B shows a mobile computer that includes the main body 2001, a camera portion 2102, an image receiving portion 2103, an operation switch 2104, a display portion 2105, etc. It is possible that the liquid crystal display device of the present invention is adapted to the display portion 2105 to thereby complete the mobile computer. FIG. 12C shows a player using a recording medium in which a program is recorded (hereinafter referred to as recording medium), which includes a main body 2201, a display portion 2202, a speaker portion 2203, a recording medium 2204, an operation switch 2205, etc. Here, in this player, employed as the recording medium is a DVD (digital versatile disc), a CD, or the like. Through this, appreciation of music or movie, a game, or an Internet can be attained. It is possible that the liquid crystal display device of the present invention is adapted to the display portion 2202 to thereby complete the player using the recording medium. In these electric appliances, through the application of the present invention, the defect in orientation of the liquid crystal due to the steps or unevennesses in the region through which a light passes in the pixel electrode can be eliminated. In addition, the capacitor element capable of obtaining a sufficient storage capacitor can be formed and thus, even if the leak current is generated, the display signal can be hold, thereby attaining a definite display without causing uneven display. Also, even if the capacitor element is formed, the opening ratio can be maintained high, so that high luminance can be obtained and the power consumption of the light source used for the display can be reduced. This contributes to the low power consumption in the whole electric appliance.

Figure 12D:
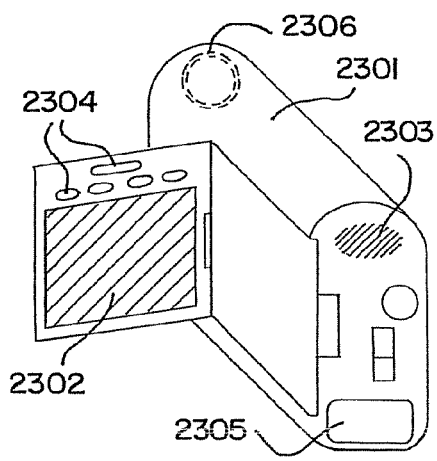
Figure 12B:
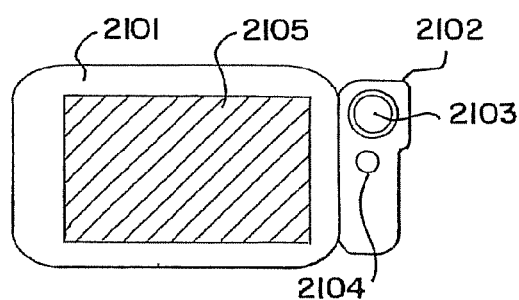
Figure 12E:
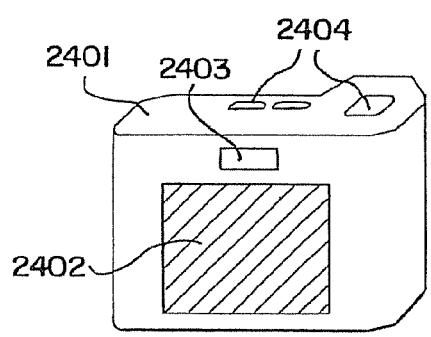
Figure 12C:
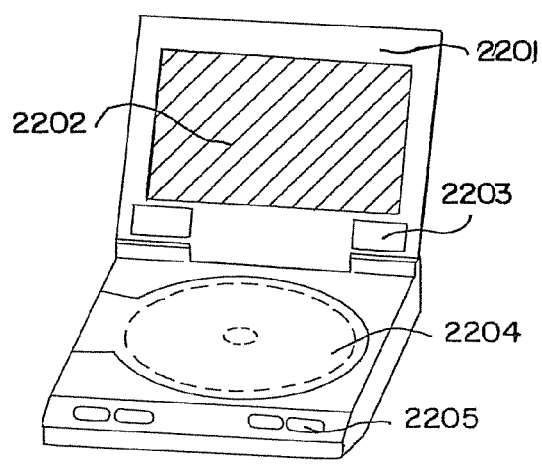
Figure 12F:
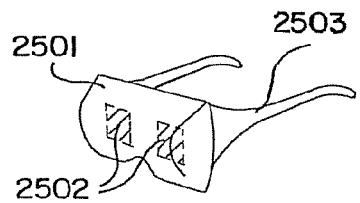
Figure 13A:
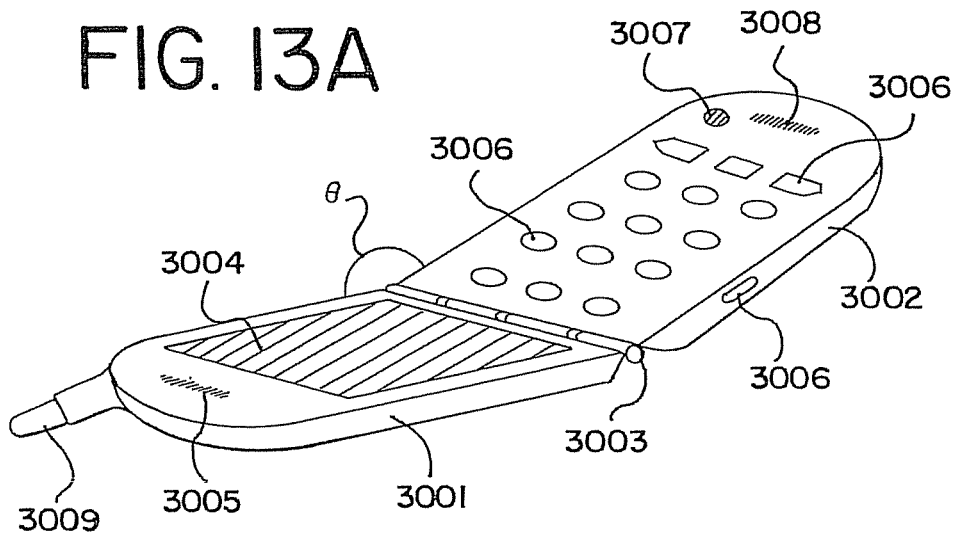
FIGS. 13A to 13C are views for showing an example of electric appliances.
Figure 13B:
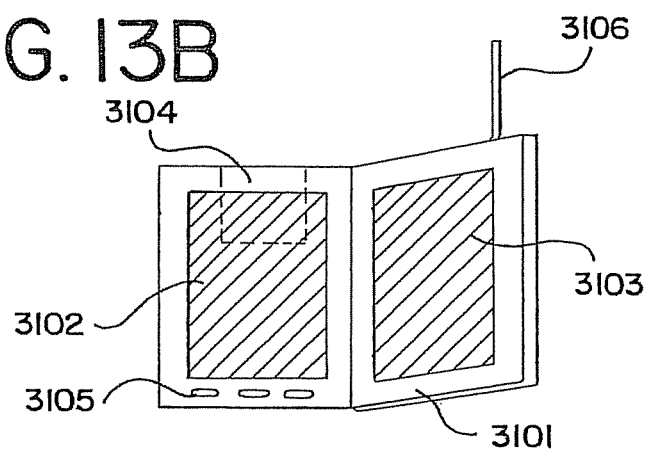

FIG. 12D shows a video camera that includes a main body 2301, a display portion 2302, a voice input portion 2303, operation switches 2304, a battery 2305, an image receiving portion 2306, etc. It is possible that the liquid crystal display device of the present invention is adapted to the display portion 2302 to thereby complete the video camera. FIG. 12E shows a digital camera, which includes a main body 2401, a display portion 2402, an eyepiece portion 2403, operation switches 2404, an image receiving portion (not shown), etc. It is possible that the liquid crystal display device of the present invention is adapted to the display portion 2402. FIG. 12F shows a goggle type display, which includes a main body 2501, display portions 2502, an arm portion 2503, etc. It is possible that the liquid crystal display device of the present invention is adapted to the display portion 2502. FIG. 13A shows a cellular phone, which includes a display panel 3001 and an operation panel 3002. The display panel 3001 and the operation panel 3002 are connected through a connection portion 3003, in which angle θ between a plane in which a display portion 3004 of the display panel 3001 is formed and a plane in which operation keys 3006 of the operation panel, 3002 are formed can be arbitrarily changed. Further, the cellular phone includes a voice output portion 3005, the operation keys 3006, a power supply switch 3007, and a voice input portion 3008. It is possible that the liquid crystal display device of the present invention is adapted to the display portion 3004 to thereby complete the cellular phone. FIG. 13B shows a portable book (electronic book), which includes a main body 3101, display portions 3102, 3103, a recording medium 3104, an operation switch 3105, an antenna 3106, etc. It is possible that the liquid crystal display device of the present invention is adapted to the display portions 3102, 3103, to thereby complete the portable book. Thus, according to the present invention, the defect in orientation of the liquid crystal can be decreased, so that a definite display can be realized without causing uneven display. Further, the capacitor element can be formed while maintaining the opening ratio high, and thus high luminance can be obtained and the power consumption of the light source used for the display can be reduced. This makes it possible to realize low power consumption in the whole electric appliance. Therefore, a compact battery with a reduced weight suffices therefor, which makes it possible to reduce the whole electric appliance in weight.

Figure 13C:
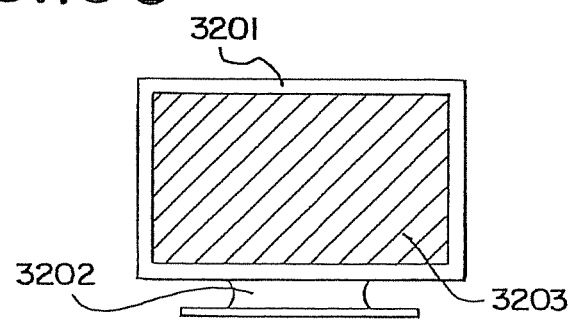

FIG. 13C show a display, which includes a main body 3201, a support 3202, a display portion 3203, etc. It is possible that the liquid crystal display device of the present invention is adapted to the display portion 3203 to thereby complete the display. According to the present invention, it is possible that the region through which a light passes (region contributing to the display) of the pixel electrode is flattened to make the step formed on the light-shielding film, so that the defect in orientation of the liquid crystal and the uneven display can be eliminated. Further, since the storage capacitor element can be formed without reducing the opening ratio, a display can be obtained with high luminance and definition.

As described above, an application range of the present invention is extremely wide and the present invention can be adapted in order to complete the electric appliances in various fields. Also, the electric appliances of this embodiment can be attained by using any liquid crystal display device manufactured according to Embodiments 1 to 6 in combination.

As disclosed in the present invention, the capacitor insulating film is formed on the light-shielding film, the conductive layer is formed on the capacitor insulating film, and the conductive layer and the pixel electrode are electrically connected so as to have the same potential, whereby all the region in which the light-shielding film and the pixel electrode are overlapped can be used as the storage capacitor element effectively. Also, through the application of the present invention, the storage capacitor element having a sufficient capacitance can be formed without reducing the opening ratio of the pixel.

Note that, the present invention is effective since, irrespective of the shape of the TFT, a capacitor wiring is formed on the light-shielding film for shielding the TFT from the light which is made of the conductive material, the conductive layer is formed on the capacitor wiring, and the potential is applied from the pixel electrode to the conductive layer to thereby attain function of the storage capacitor element.

What is claimed is:

1. A semiconductor device comprising:
a substrate;
a first conductive layer over the substrate;
a first insulating film over the first conductive layer;
a thin film transistor over the first insulating film and the first conductive layer, the thin film transistor comprising a gate insulating film having a contact hole and a gate electrode on the gate insulating film;
source and drain wirings on the gate insulating film, the source and drain wirings electrically connected to the thin film transistor through the contact hole; and
a pixel electrode over the the thin film transistor, the pixel electrode electrically connected to the thin film transistor.

2. A semiconductor device according to claim 1, further comprising an electrode in a driver circuit portion, the electrode comprising a same material of the pixel electrode, wherein the substrate having a pixel portion and the driver circuit portion.

3. A semiconductor device according to claim 1, wherein the substrate comprises a material selected from the group consisting of glass, quartz, silicon, metal and plastic.

4. A semiconductor device according to claim 1, wherein the first conductive layer comprises a material selected from the group consisting of Ta, W, Ti, Mo, Al, Cu, Cr, and Nd.

5. A semiconductor device according to claim 1, wherein the first conductive layer is electrically connected to the gate electrode.

6. A semiconductor device according to claim 1, further comprising:
a second insulating film over the thin film transistor, the second insulating film having a planarized surface; and
a second conductive layer over the second insulating film, wherein at least one part of the thin film transistor is overlapped with a part of the second conductive layer.

7. A semiconductor device according to claim 1, further comprising:
a second insulating film over the thin film transistor, the second insulating film having a planarized surface;
a second conductive layer over the second insulating film; and
a third insulating film over the second conductive layer, wherein the third insulating film comprises at least one of an inorganic insulating film and an organic insulating film.

8. A semiconductor device according to claim 1, further comprising:
a second insulating film over the thin film transistor, the second insulating film having a planarized surface; and
a second conductive layer over the second insulating film, wherein the second conductive layer comprises a light-shielding film.

9. A semiconductor device according to claim 1, wherein the pixel electrode comprises a transparent conductive film.

10. A semiconductor device, according to claim 1, wherein the semiconductor device is applied to an electric appliance selected from the group consisting of a projector, a personal computer, a video camera, a goggle type display and a display.

11. A semiconductor device according to claim 1, wherein at least a channel region of the thin film transistor is overlapped with the first conductive layer.

12. A semiconductor device comprising:
a substrate having a pixel portion and a driver circuit portion;
a first conductive layer over the substrate;
a first insulating film over the first conductive layer;
a thin film transistor over the first insulating film and the first conductive layer, the thin film transistor comprising a gate insulating film having a contact hole and a gate electrode on the gate insulating film;
source and drain wirings on the gate insulating film, the source and drain wirings electrically connected to the thin film transistor through the contact hole;

a second insulating film over the thin film transistor, the second insulating film having a planarized surface;

a second conductive layer over the second insulating film;

a third insulating film over the second conductive layer; and a pixel electrode over the second conductive layer with the third insulating film interposed therebetween, the pixel electrode electrically connected to the thin film transistor, wherein at least a channel region of the thin film transistor is overlapped with the first conductive layer, wherein an end portion of the pixel electrode is overlapped with the second conductive layer, and wherein the source and drain wirings comprise molybdenum.

13. A semiconductor device according to claim 12, further comprising an electrode in the driver circuit portion, the electrode comprising a same material of the pixel electrode.

14. A semiconductor device according to claim 12, wherein the substrate comprises a material selected from the group consisting of glass, quartz, silicon, metal and plastic.

15. A semiconductor device according to claim 12, wherein the first conductive layer comprises a material selected from the group consisting of Ta, W, Ti, Mo, Al, Cu, Cr, and Nd.

16. A semiconductor device according to claim 12, wherein the first conductive layer is electrically connected to the gate electrode.

17. A semiconductor device according to claim 12, wherein at least one part of the thin film transistor is overlapped with a part of the second conductive layer.

18. A semiconductor device according to claim 12, wherein the third insulating film comprises at least one of an inorganic insulating film and an organic insulating film.

19. A semiconductor device according to claim 12, wherein the second conductive layer comprises a light-shielding film.

20. A semiconductor device according to claim 12, wherein the pixel electrode comprises a transparent conductive film.

21. A semiconductor device according to claim 12, wherein the semiconductor device is applied to an electric appliance selected from the group consisting of a projector, a personal computer, a video camera, a goggle, type display and a display.

22. A semiconductor device comprising:

a substrate having a pixel portion and a driver circuit portion;

a first conductive layer over the substrate;

a first insulating film over the first conductive layer;

a thin film transistor over the first insulating film and the first conductive layer, the thin film transistor comprising a semiconductor layer, a gate insulating film having a contact hole and a gate electrode on the gate insulating film;

source and drain wirings on the gate insulating film, the source and drain wirings electrically connected to the thin film transistor through the contact hole;

a second insulating film over the thin film transistor, the second insulating film having a planarized surface;

a second conductive layer over the second insulating film;

a third insulating film over the second conductive layer; and a pixel electrode over the second conductive layer with the third insulating film interposed therebetween, the pixel electrode electrically connected to the thin film transistor, wherein at least a channel region of the thin film transistor is overlapped with the first conductive layer, wherein the gate electrode of the thin film transistor comprises molybdenum, and wherein the source and drain wirings comprise molybdenum.

23. A semiconductor device according to claim 22, further comprising an electrode in the driver circuit portion, the electrode comprising a same material of the pixel electrode.

24. A semiconductor device according to claim 22, wherein the substrate comprises a material selected from the group consisting of glass, quartz, silicon, metal and plastic.

25. A semiconductor device according to claim 22, wherein the first conductive layer comprises a material selected from the group consisting of Ta, W, Ti, Mo, Al, Cu, Cr, and Nd.

26. A semiconductor device according to claim 22, wherein the first conductive layer is electrically connected to the gate electrode of the thin film transistor.

27. A semiconductor device according to claim 22, wherein at least one part of the thin film transistor is overlapped with a part of the second conductive layer.

28. A semiconductor device according to claim 22, wherein the third insulating film comprises at least one of an inorganic insulating film and an organic insulating film.

29. A semiconductor device according to claim 22, wherein the second conductive layer comprises a light-shielding film.

30. A semiconductor device according to claim 22, wherein the pixel electrode comprises a transparent conductive film.

31. A semiconductor device according to claim 22, wherein the semiconductor device is applied to an electric appliance selected from the group consisting of a projector, a personal computer, a video camera, a goggle type display and a display.

32. A semiconductor device comprising:

a substrate having a pixel portion and a driver circuit portion;

a first conductive layer over the substrate;

a first insulating film over the first conductive layer;

a thin film transistor over the first insulating film and the first conductive layer, the thin film transistor comprising a semiconductor layer, a gate insulating film having a contact hole and a gate electrode on the gate insulating film;

source and drain wirings on the gate insulating film, the source and drain wirings electrically connected to the thin film transistor through the contact hole;

a second insulating film over the thin flu transistor, the second insulating film having a planarized surface;

a second conductive layer over the second insulating film;

a third insulating film over the second conductive layer; and a pixel electrode over the second conductive layer with the third insulating film interposed therebetween, the pixel electrode electrically connected to the thin film transistor, wherein at least a channel region of the thin film transistor is overlapped with the first conductive layer, wherein the gate electrode of the thin film transistor comprises molybdenum, wherein an end portion of the pixel electrode is overlapped with the second conductive layer, and wherein the source and drain wirings comprise molybdenum.

33. A semiconductor device according to claim 32, further comprising an electrode in the driver circuit portion, the electrode comprising a same material of the pixel electrode.

34. A semiconductor device according to claim 32, wherein the substrate comprises a material selected from the group consisting of glass, quartz, silicon, metal and plastic.

35. A semiconductor device according to claim 32, wherein the first conductive layer comprises a material selected from the group consisting of Ta, W, Ti, Mo, Al, Cu, Cr, and Nd.

36. A semiconductor device according to claim 32, wherein the first conductive layer is electrically connected to the gate electrode of the thin film transistor.

37. A semiconductor device according to claim 32, wherein at least one part of the thin film transistor is overlapped with a part of the second conductive layer.

38. A semiconductor device according to claim 32, wherein the third insulating film comprises at least one of an inorganic insulating film and an organic insulating film.

39. A semiconductor device, according to claim 32, wherein the second conductive layer comprises a light-shielding film.

40. A semiconductor device according to claim 32, wherein the pixel electrode comprises a transparent conductive film.

41. A semiconductor device according to claim 32, wherein the semiconductor device is applied to an electric appliance selected from the group consisting of a projector, a personal computer, a video camera, a goggle type display and a display.

* * * * *

UNITED STATES PATENT AND TRADEMARK OFFICE
CERTIFICATE OF CORRECTION

PATENT NO. : 8,502,231 B2
APPLICATION NO. : 13/474993
DATED : August 6, 2013
INVENTOR(S) : Tatsuya Arao It is certified that error appears in the above-identified patent and that said Letters Patent is hereby corrected as shown below:

In the Specification:

Column 5, line 33; Change "TFT's" to --TFTs--.
Column 8, line 27; Change "suitably et by" to --suitably set by--.
Column 9, line 8; Change "TFT's" to --TFTs--.
Column 9, line 60; Change "loaned" to --formed--.
Column 16, line 60-61; Change "third, harmonic" to --third harmonic--.
Column 18, line 65-66; Change "panel, 3002" to --panel 3002--.

In the Claims:

Column 22, line 45, claim 32; Change "flu" to --film--.

Signed and Sealed this
Seventeenth Day of December, 2013

Margaret A. Focarino
*Commissioner for Patents of the United States Patent and Trademark Office*